United States Patent
Nakayama et al.

(10) Patent No.: US 7,881,086 B2
(45) Date of Patent: Feb. 1, 2011

(54) POWER CONVERSION DEVICE AND FABRICATING METHOD FOR THE SAME

(75) Inventors: Yasushi Nakayama, Chiyoda-ku (JP); Takeshi Oi, Chiyoda-ku (JP); Kazuyoshi Toya, Chiyoda-ku (JP); Akihiro Murahashi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 279 days.

(21) Appl. No.: 12/293,934

(22) PCT Filed: Mar. 8, 2007

(86) PCT No.: PCT/JP2007/054505
§ 371 (c)(1),
(2), (4) Date: Sep. 22, 2008

(87) PCT Pub. No.: WO2007/113979
PCT Pub. Date: Oct. 11, 2007

(65) Prior Publication Data
US 2009/0219696 A1    Sep. 3, 2009

(30) Foreign Application Priority Data
Mar. 30, 2006 (JP) ............................. 2006-093424

(51) Int. Cl.
*H05K 7/20* (2006.01)
*H02M 7/5387* (2007.01)
*H01B 5/00* (2006.01)

(52) U.S. Cl. .................. 363/144; 363/141; 361/611; 361/711

(58) Field of Classification Search .............. 363/131, 363/132, 141, 144, 147; 361/611, 702, 711
See application file for complete search history.

(56) References Cited

U.S. PATENT DOCUMENTS

| | | | | |
|---|---|---|---|---|
| 5,623,399 A | * | 4/1997 | Ishii et al. | 363/132 |
| 5,835,362 A | | 11/1998 | Keller et al. | |
| 5,872,711 A | * | 2/1999 | Janko | 363/144 |
| 6,259,617 B1 | * | 7/2001 | Wu | 363/144 |

(Continued)

FOREIGN PATENT DOCUMENTS

JP    2 174564    7/1990

(Continued)

*Primary Examiner*—Gary L Laxton
(74) *Attorney, Agent, or Firm*—Oblon, Spivak, McClelland, Maier & Neustadt, L.L.P.

(57) ABSTRACT

A power conversion device in which the inductance of a main circuit is reduced, a surge voltage is suppressed, elements are properly cooled, which is miniaturized and reduced in weight as a whole, and is excellent in handling performance in a manufacturing process and a maintenance work. A positive side arm unit includes IGBT modules, a coupling diode module, a cooling plate on which the modules are mounted, and a first laminated bus bar connected to the respective modules. A negative side arm unit includes IGBT modules, a coupling diode module, a cooling plate on which the modules are mounted, and a second laminated bus bar connected to the respective modules, and both the laminated bus bars and the capacitors are connected to one another by a third laminated bus bar. Both the cooling plates are parallel to each other so that the mount surfaces thereof are set in the same direction.

17 Claims, 22 Drawing Sheets

U.S. PATENT DOCUMENTS

| | | | |
|---|---|---|---|
| 6,618,278 B2 * | 9/2003 | Suzuki et al. | 363/144 |
| 7,505,294 B2 * | 3/2009 | Ahmed et al. | 363/141 |

FOREIGN PATENT DOCUMENTS

| | | |
|---|---|---|
| JP | 10 201249 | 7/1998 |
| JP | 11 89249 | 3/1999 |
| JP | 2004 96832 | 3/2004 |
| JP | 2005 287214 | 10/2005 |
| JP | 2005 287267 | 10/2005 |

* cited by examiner (a)

(b)

(c)

(d)

(a)

(b)

(c)

POWER CONVERSION DEVICE AND FABRICATING METHOD FOR THE SAME

TECHNICAL FIELD

The present invention relates to a mount technique for a power conversion device using a semiconductor element for power, and particularly to a technique of performing reduction in size and weight of a device while reducing the inductance of a main circuit.

BACKGROUND ART

The construction of a conventional power conversion device is shown in Patent Document 1, for example. This patent document relates to a so-called 3-level power conversion device, and as shown in FIG. 1, a first switching element, a second switching element and a first coupling diode which constitute a positive side arm are mounted on one surface of a cooling plate, and a third switching element, a fourth switching element and a second coupling diode which constitute a negative side arm are mounted on the opposite surface. For the electrical connection of each switching element, the coupling diode and a capacitor serving as a DC power source, a laminated bus bar obtained by laminating bus bars so that an insulating material is sandwiched therebetween is used, and it is constructed in a U-shape as a whole.

The construction of another conventional power conversion device is shown in FIG. 3 of Patent Document 2. FIG. 3 shows a so-called 2-level power conversion device, and a piece arm is constructed by connecting three switching elements in series. The switching elements of the positive side arm and the negative side arm are disposed so that the connection faces thereof are opposite to each other, and a cooing plate is secured to each switching element. For the electrical connection to the switching element and the DC power source side, a laminated bus bar obtained by laminating bus bars so that an insulating material is sandwiched therebetween is used, and it is constructed in a U-shape as a whole as in the case of the Patent Document 1.

Furthermore, the construction of another conventional power conversion device is shown in FIG. 4 of Patent Document 3. FIG. 4 shows a 2-level power conversion device constructed by a converter and an inverter. One-phase member, that is, a switching element of a positive side arm and a switching element of a negative side arm are mounted on one cooling plate and united, and respective units (respective phases) are stacked so that the cooling plates are parallel to one another.

Patent Document 1: JP-A-10-201249

Patent Document 2: U.S. Pat. No. 5,835,362

Patent Document 3: JP-A-2004-96832

DISCLOSURE OF THE INVENTION

Problem to be Solved by the Invention

In the power conversion device for performing power conversion such as DC-AC or the like by turning on/off a switching element as described above, when the switching element is turned off, a surge voltage is applied to the turn-off element by current variation and the inductance of the main circuit at the turn-off time. When the surge voltage is high, the element may be broken, and thus it is required to suppress the surge voltage. The surge voltage increases in accordance with the inductance of the main circuit, and thus suppression of the inductance is effective to reduction of the surge voltage. A method of absorbing the surge voltage by a snubber circuit comprising a capacitor, etc. is known as a method of suppressing the surge voltage, however, there is a problem that the application of the snubber circuit increases the size of the device and reduces the reliability.

Furthermore, power loss occurs in power semiconductor elements such as a switching element, a coupling diode, etc. at the current supply time or at the switching time. The occurring loss is absorbed by a cooling plate or the like. When the power loss of the element is large or when the cooling capacity of the cooling plate is low, the element temperature is excessively high, and thus the element may be broken. Accordingly, it is required to construct the cooling plate properly so that the element temperature is not excessively high.

In the power conversion device disclosed in Patent Document 1, for the electrical connection, a laminate bus bar obtained by laminating bus bars so that an insulating material is sandwiched therebetween is used, however, it is estimated that the inductance is low, and the switching element and the coupling diode of the positive side and negative side arms are cooled by one cooling plate. Therefore, it may be difficult to cool all the elements in case of some element loss or some cooling performance of the cooling plate. Furthermore, the switching element and the coupling diode of the positive side and negative side arms are mounted on one cooling plate, so that the dealing unit is large, and the dealing performance is lowered at the manufacturing time and the maintenance time.

Furthermore, in the power conversion device shown in FIG. 3 of the Patent Document 2, the cooling plate is provided every element. However, with respect to the electrode-provided sides of the positive side arm and the negative side arm, it is required to secure a necessary electrical insulation distance between each side and an accommodating case as shown in FIG. 3, for example. On the other hand, no electrical insulation is required between the cooling plate on which the positive side arm is mounted and the cooling plate on which the negative side arm is mounted, however, there is a case where they cannot be brought into close contact with each other due to the construction of the cooler (for example, fixing to a fin, a heat exchanger, a device or the like), so that the space therebetween becomes a dead space. Accordingly, the overall size of the device becomes large.

Still furthermore, in the power conversion device disclosed in the Patent Document 3, unitization is performed every phase, and units are stacked, whereby the mount density of the device is enhanced, and the overall device can be miniaturized and reduced in weight. Furthermore, the handling performance of the device in the manufacturing process and the maintenance operation may be enhanced. However, for example, in the case of 3-level or the like, no other construction is provided. Furthermore, there is a description on low inductance, however, a specific electrical connection method for the proximity of an element is not provided.

The present invention has been implemented to solve the problem as described above, and has an object to provide a power conversion device that is configured so that the inductance of a main circuit is reduced, a surge voltage is suppressed and elements are properly cooled, miniaturized and reduced in weight and also has excellent handling performance in a manufacturing process and a maintenance process.

Means of Solving the Problem

A power conversion device according to a first invention, a power conversion device including a semiconductor element that is connected between an AC terminal and a positive terminal of a DC power source and constitutes a positive side arm, and a semiconductor element that is connected between the AC terminal and a negative terminal of the DC power source and constitutes a negative side arm, power conversion being performed between the DC power source and the AC terminal by turn-on/off operation of the semiconductor element, comprises: a first cooling plate on which the semiconductor element constituting the positive side arm is mounted; a second cooling plate that is disposed in parallel to the first cooling plate so that the mount surface thereof is set in the same direction as the first cooling plate; and a laminated bus bar that connects the semiconductor element constituting the positive side arm and the DC power source, connects the semiconductor element constituting the negative side arm and the DC power source, connects the semiconductor element constituting the positive side arm and the semiconductor element constituting the negative side arm, and is formed by laminating electrically conductive bus bars so that an insulating material is sandwiched therebetween.

A power conversion device according to a second invention that includes: a U-phase positive side switching element connected between a positive terminal of a DC power source and a U-phase AC terminal, a V-phase positive side switching element connected between the positive terminal of the DC power source and a V-phase AC terminal, and a W-phase positive side switching element connected between the positive terminal of the DC power source and a W-phase AC terminal as a semiconductor element constituting a positive side arm; and a U-phase negative side switching element connected between a negative terminal of the DC power source and the U-phase AC terminal, a V-phase negative side switching element connected between the negative terminal of the DC power source and the V-phase AC terminal, and a W-phase negative side switching element connected between the negative terminal of the DC power source and the W-phase AC terminal as a semiconductor element constituting a negative side arm, 2-level potential of the positive terminal and the negative terminal of the DC power source being output to the U-phase, V-phase and W-phase AC terminals of three phases by the turn-on/off operation of the switching elements, comprises: a first cooling plate on which positive side and negative side switching elements of any one phase of the three phases of U, V and W and a positive side or negative side switching element of any one phase of the other two phases are mounted; a second cooling plate that is disposed in parallel to the first cooling plate so that the mount surface thereof is set in the same direction as the first cooling plate, and a negative side or positive side switching element of any one phase of the other two phases which is not mounted on the first cooling plate, and positive side and negative side switching elements of the other phase of the other two phases are mounted; and a laminated bus bar that connects the switching element constituting the positive side arm and the DC power source, connects the switching element constituting the negative side arm and the DC power source and connects the semiconductor element constituting the positive side arm and the semiconductor element constituting the negative side arm and is obtained by laminating electrically conductive bus bars so that an insulating material is sandwiched therebetween.

A method of fabricating a power conversion device according to a third invention comprises: a first step of connecting a semiconductor element mounted on a first cooling plate and a first laminated bus bar; a second step of connecting a semiconductor element mounted on a second cooling plate and a second laminated bus bar; and a third step of connecting a connection portion of the first and second laminated bus bars and a third laminated bus bar, after the first and second steps.

Effect of the Invention

According to the first invention, the semiconductor element of the positive side arm and the semiconductor element of the negative side arm are cooled by different cooling plates, and thus as compared with the semiconductor elements of the positive side and negative side arms are cooled by one cooling plate, the semiconductor elements can be more properly cooled even when the loss of the semiconductor elements is large and even when the capacity of a cooler is deficient.

Furthermore, the cooling plates can be constructed so that they are spaced from each other in advance because of the arrangement of elements and the insulation distance and thus the dead space is nullified. The outside of one cooling plate is in close contact with an accommodating case, for example, and thus the device can be miniaturized and reduced in weight as a whole.

Furthermore, the positive side arm and the negative side arm are mounted on the different cooling plates. Accordingly, it is not necessarily required that the positive side arm element and the negative side arm element are adjacent to each other, and thus the degree of freedom of the possible construction can be more enhanced as compared with a case where they are mounted every phase.

Still furthermore, the connection between the switching element constituting the positive side arm and the DC power source, the connection between the switching element constituting the negative side arm and the DC power source and the connection between the semiconductor element constituting the positive side arm and the negative side arm are performed by the laminated bus bar. Therefore, the inductance at these connection portions can be surely reduced.

According to the second invention, with respect to the other two phases excluding one phase, the positive side switching element and the negative side switching element are disposed in proximity to each other, and thus the inductance is reduced as a whole.

According to the third invention, the work of mounting the semiconductor elements on the cooling plates and the work of connecting the semiconductor elements and the laminated bus bar can be individually executed every cooling plate, thus the handling performance in the manufacturing process and the maintenance process can be enhanced.

BEST MODES FOR CARRYING OUT THE INVENTION

An embodiment of the present invention will be described hereunder with reference to the accompanying drawings.

First Embodiment

Figure 1:
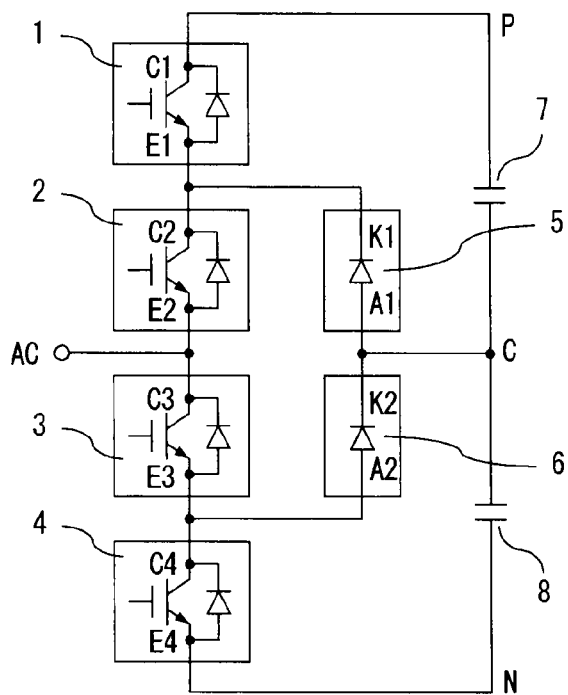
FIG. 1 is a circuit diagram showing a power conversion device according to a first embodiment of the present invention.

FIG. 1 is a circuit diagram of one phase of a power conversion device constructed in a first embodiment. The first embodiment relates to a 3-level power conversion device used for power conversion between a DC power source having three potentials of a positive pole (P), a negative pole (N) and an intermediate potential (C) and alternating current. In all embodiments, an IGBT module is used as a switching element as a semiconductor element, however, any semiconductor element having a switching function such as MOSFET or the like may be constructed.

An IGBT module 1 as a first switching element, an IGBT module 2 as a second switching element, an IGBT module 3 as a third switching element and an IGBT module 4 as a fourth switching element are connected in series between the positive pole (P) and the negative pole (N), and the connection point between the IGBT module 2 and the IGBT module 3 is connected to an alternating current terminal (AC). Furthermore, a coupling diode module 5 as a first coupling diode is connected between the connection point of the IGBT module 1 and the IGBT module 2 and the intermediate potential (C), and a coupling diode module 6 as a second coupling diode module is connected between the connection point of the IGBT module 3 and the IGBT module 4 and the intermediate potential (C). A capacitor 7 and a capacitor 8 are connected to each other in series, constitutes a DC power source, and has a positive pole (P), a negative pole (N) and a terminal for outputting an intermediate potential (N).

Figure 2:
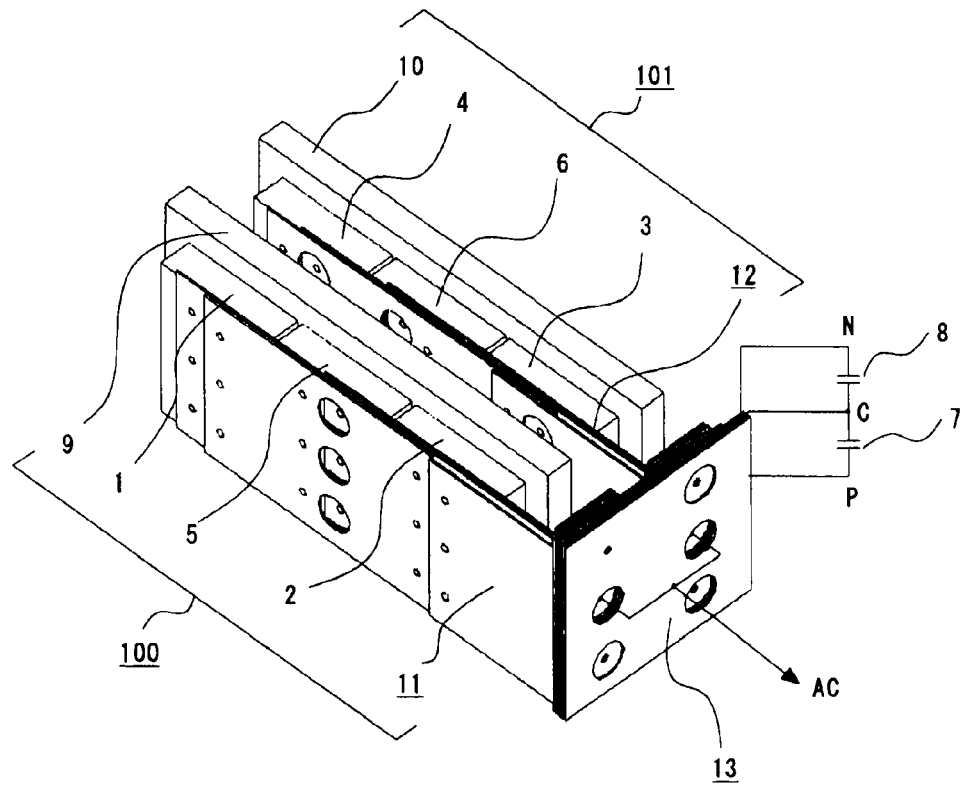
FIG. 2 is a diagram showing the construction of the power conversion device according to the first embodiment of the present invention.

FIG. 2 shows the construction of the power conversion device according the first embodiment. FIG. 2 shows an one phase component of the 3-level power conversion device, and it comprises a positive side arm unit 100, a negative side arm unit 101, a third laminated bus bar 13 and capacitors 7, 8. The positive side arm unit 100 comprises an IGBT module 1, a coupling diode module 5, an IGBT module 2, a first cooling plate 9 on which the respective modules are mounted, and a first laminated bus bar 11 connected to each module. The negative side arm unit 101 comprises an IGBT module 3, a coupling diode module 6, an IGBT module 4, a second cooling plate 10 on which the respective modules are mounted, and a second laminated bus bar 12 connected to each module.

The positive side arm unit 100 and the negative side arm unit 101 are disposed to be stacked so that the cooling plates 9 and 10 are in parallel to each other and the modules are mounted on the same plane as the cooling plates 9, 10. Furthermore, the cooling plate 9 and the module terminal connection portion of the negative side arm unit 101 are spaced from each other so as to keep a proper insulating distance therebetween. The cooling plates 9, 10 serve to radiate the heat of the modules to the outside, and circulation of liquid, boiling or the like is used. In this construction, three modules are mounted on one cooling plate, however, a cooling plate may be provided every element as in the case of the Patent Document 2.

The positive side arm unit 100 and the negative side arum unit 101 are electrically connected to each other by the laminated bus bar 13. The laminated bus bar 13 is obtained by laminating bus bars formed of planar conductors so that an insulating material is sandwiched between the bus bars.

Figure 3:
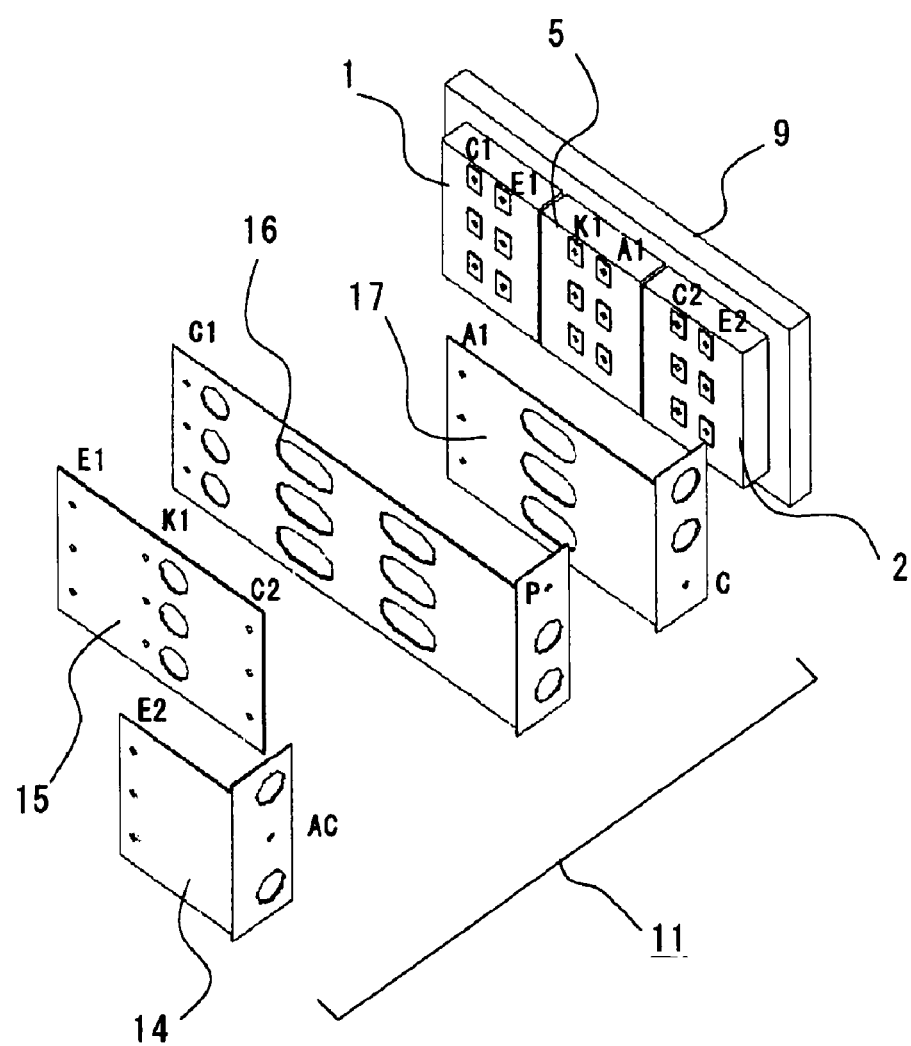
FIG. 3 is a perspective view showing the connection construction of a laminated bus bar 11 of FIG. 2.

Next, the structure and connection construction of the laminated bus bars 11, 12, 13 will be described in detail with reference to FIGS. 3 to 5. FIG. 3 is a perspective view showing the connection of the modules 1, 2, 5 constituting the positive side arm unit 100 and the laminated bus bar 11, and the bus bars are illustrated as being spaced from one another. An insulating material is provided between the bus bars so that the bus bars are insulated from each other although it is not shown with respect to all the laminated bus bars. Small opening portions formed in the bus bars are used for connection, and large opening portions are formed for insulation from the connection portions of adjacent bus bars.

The laminated bus bar 11 serves to lead out the potential of each of the modules 1, 2, 5 of the positive side arm unit 100 to the connection portion which is located in a direction connecting to the DC power source (in the direction to the right and front side in FIG. 3), and it is constructed by laminating the bus bars 14, 15, 16, 17. The bus bars 14, 16, 17 connected to the laminated bus bar 13 is bent at a right angle and formed in an L-shape at the connection portion.

The bus bar 14 is a bus bar connected to the alternating current terminal (AC) side and it is connected to an emitter electrode (E2) as a negative electrode of the IGBT module 2. The bus bar 15 connects an emitter electrode (E1) of the IGBT module 1, a cathode electrode (K1) as a negative electrode of the coupling diode module 5 and a collector electrode (C2) as a positive electrode of the IGBT module 2. The bus bar 16 is a bus bar connected to the positive pole (P) and it is connected to a collector electrode (C1) of the IGBT module 1. The bus bar 17 is a bus bar connected to the intermediate potential (C), and it is connected to an anode electrode (A1) as a positive electrode of the coupling diode module 5.

Figure 4:
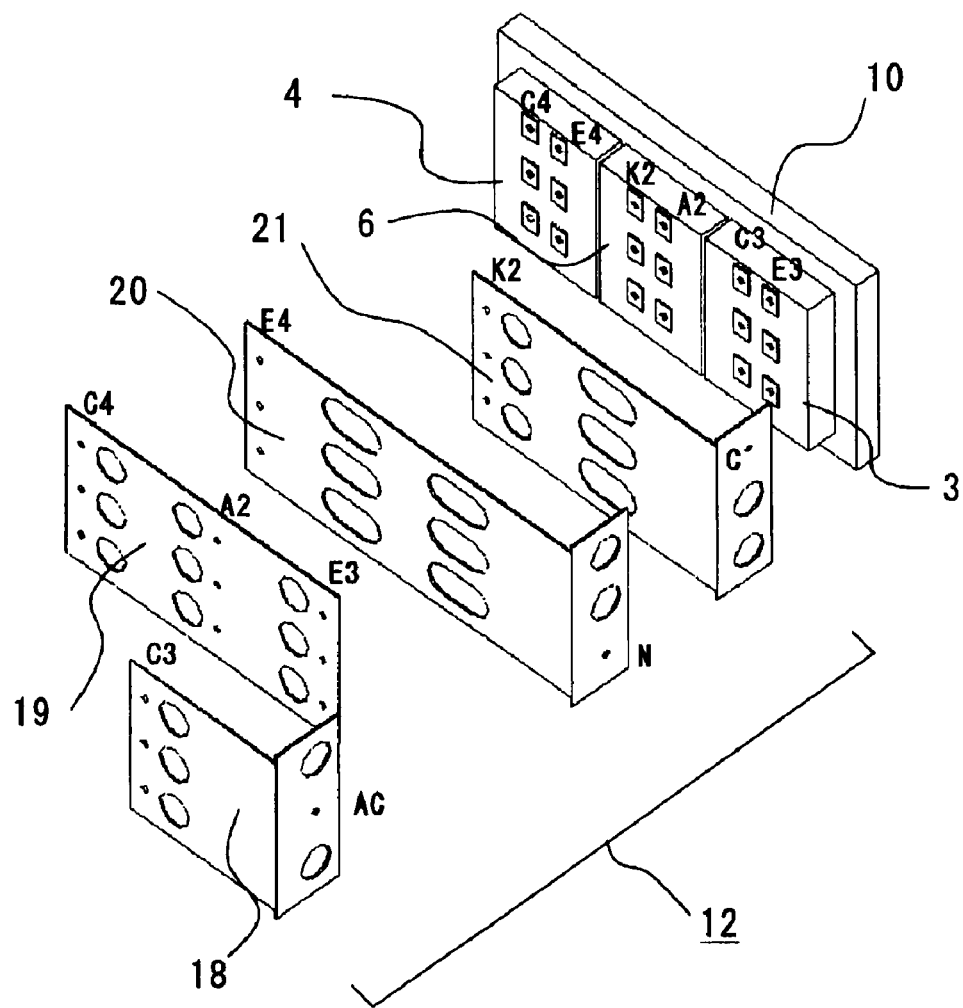
FIG. 4 is a perspective view showing the connection construction of a laminated bus bar 12 of FIG. 2.

FIG. 4 is a perspective view showing the connection of the modules 3, 4, 6 constituting the negative side arm unit 101 and the laminated bus bar 12. The laminated bus bar 12 serves to lead out the potential of each of the modules 3, 4, 6 of the negative side arm unit 101 to the connection portion located in a direction connecting to the DC power source (in the direction to the right and front side in FIG. 4), and it is constructed by laminating bus bars 18, 19, 20, 21. The bus bars 18, 20, 21 connected to the laminated bus bar 13 are bent in a right angle in the same direction as the laminated bus bar 11 of the positive side arm unit 100 at the connection portion, and formed in an L-shape as shown in FIG. 4.

The bus bar 18 is a bus bar connected to the alternating current terminal (AC) side, and it is connected to a collector electrode (C3) of the IGBT module 3. The bus bar 19 connects an emitter electrode (E3) of the IGBT module 3, an anode electrode (A2) of the coupling diode module 6 and a collector electrode (C4) of the IGBT module 4. The bus bar 20 is a bus bar connected to the negative pole (N), and connected to an emitter electrode (E4) of the IGBT module 4. The bus bar 21 is a bus bar connected to the intermediate potential (C), and connected to a cathode electrode (K2) of the coupling diode module 6.

Figure 5:
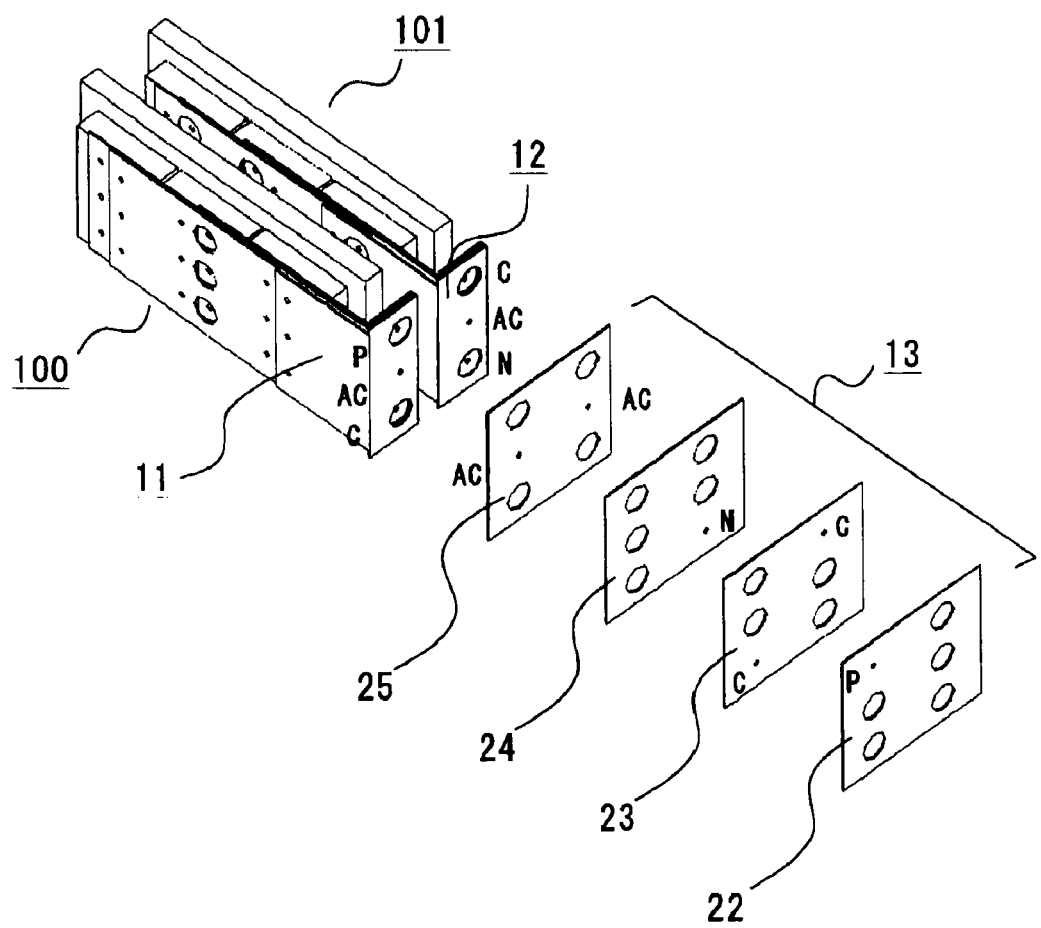
FIG. 5 is a perspective view showing the connection construction of a laminated bus bar 13 of FIG. 2.

FIG. 5 is a perspective view showing the connection of the positive side arm unit 100, the negative side arm unit 101 and the laminated bus bar 13. The laminated bus bar 13 is formed in a planar shape to be parallel to the connection portion of the laminated bus bars 11, 12, and it is constructed by bus bars 22, 23, 24, 25.

The bus bar 22 is connected to the positive pole connection portion (P) of the laminated bus bar 11, the bus bar 23 is connected to the intermediate potential connection portion (C) between the laminated bus bar 11 and the laminated bus bar 12, and the bus bar 24 is connected to the negative pole connection portion (N) of the laminated bus bar 12. Furthermore, as shown in FIG. 2, the bus bar 22 is connected to the positive pole (P) of the capacitor 7, the bus bar 23 is connected to the intermediate potential (C) corresponding to the connection point between the capacitor 7 and the capacitor 8, and the bus bar 24 is connected to the negative pole (N) of the capacitor 8. The bus bar 25 is a bus bar connecting the alternating current connection portions of the laminated bus bar 11 and the laminated bus bar 12, and it is output to the alternating current terminal (AC) as shown in FIG. 2. In FIG. 2, the alternating current connection portions of the laminated bus bars 11, 12 and the laminated bus bar 13 are output to the alternating current terminal (AC) as alternating current terminals. However, a terminal for outputting to the alternating current terminal (AC) may be separately provided to the bus bar 25.

Furthermore, the bus bar 14 of the positive side arm unit 100, the bus bar 18 of the negative side arm unit and the bus bar 25 for connecting them are constructed by different bus bars, however, they may be constructed as an integral body. However, in this case, the merit that unitization is carried out every arm is lost.

In the fabrication process, after the positive side arm unit 100 and the negative side arm unit 101 are fabricated, they are connected to the laminated bus bar 13. In a detachment process, conversely, the positive side arm unit 100 and the negative side arm unit 101 are first detached from the laminated bus bar 13. In this case, the same handling as the case where unitization is carried out every arm is possible, and the handing performance in the manufacturing process and the maintenance process can be enhanced.

The construction of one phase will be described above. When a power conversion device of a single phase or three-phase based on the combination of two phases is constructed, the device may be fabricated while the combination of the positive side arm unit 100 and the negative side arm unit 101 is added.

Next, the suppression of the inductance of the main circuit by the above construction will be described. When the inductance of the main circuit is large, a surge voltage which occurs in connection with turn-off increases, and thus it is a large problem to suppress the inductance of the main circuit. When the switching element is turned off, current commutates and flows to the diode. The surge voltage occurs in connection with the current variation, and thus it is necessary to suppress the inductance a loop connecting a current-varying route, that is, a route in which current flows before turn-off, but no current flows after turn-off and a route in which current flows after turn-off (hereinafter referred to as commutating loop).

Figure 6:
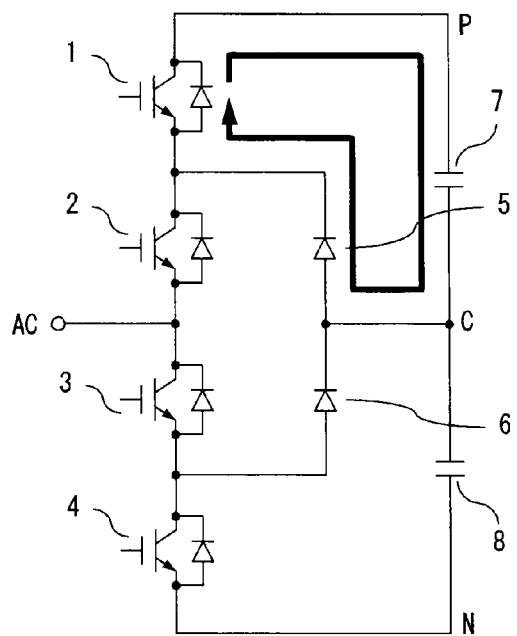
FIG. 6 is a circuit diagram showing a commutating loop in FIG. 1.
Figure 6:
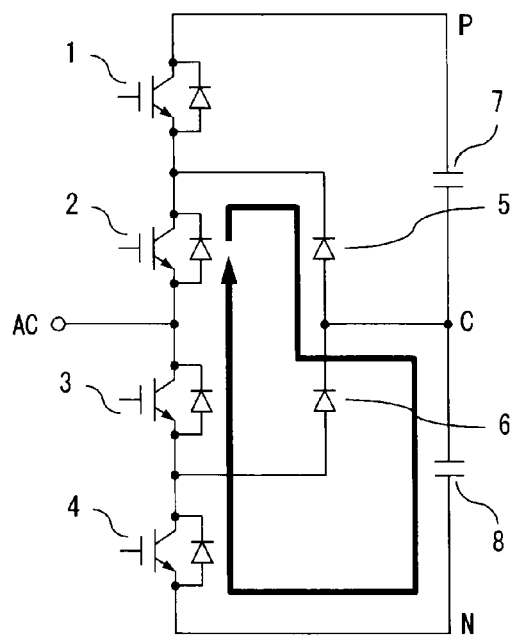
Figure 6:
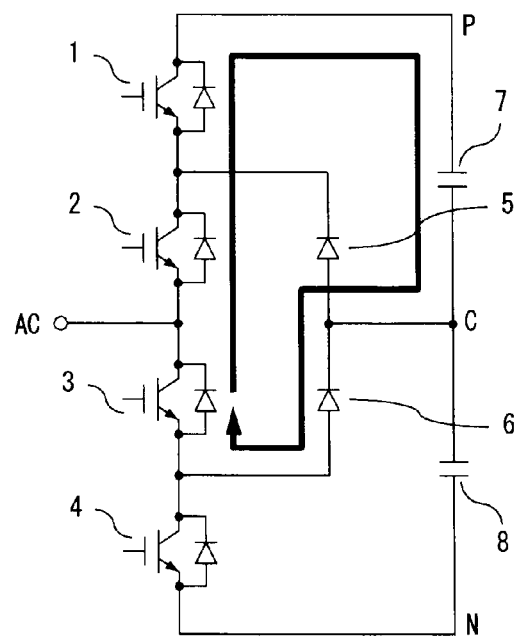
Figure 6:
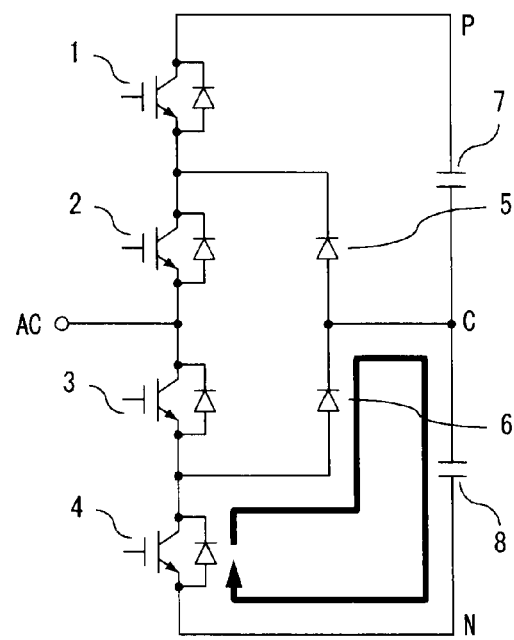

The 3-level power conversion device has four commutating modes based on the switching operation of IGBT modules 1 to 4 as switching elements. FIG. 6 shows a circuit for generating a commutating loop. FIG. 6(a) shows a case where the IGBT module is turned off to commutate current to the coupling diode module 5 from the state that current flows through the route of P→IGBT 1→IGBT 2→AC. A surge voltage occurring in the inductance of the commutating loop of IGBT 1→capacitor 7→coupling diode 5→IGBT 1 indicated by a heavy line in FIG. 6 is applied to the IGBT module 1. FIG. 6(b) shows a case where the IGBT module 2 is turned off to commutate current to the reversely-connected diodes of the IGBT module 3, the IGBT module 4 from the state that current flows through the route of C→coupling diode 5→IGBT 2→AC. A voltage occurring in the inductance of the commutating loop of IGBT 2 coupling diode 5→capacitor 8 IGBT 4→IGBT 3→IGBT 2 represented by a heavy line in FIG. 6(b) is applied to the IGBT module 2.

Likewise, FIGS. 6(c),(d) show the cases where the IGBT module 3, the IGBT module 4 are turned off, and the surge voltages occurring in the inductance of the commutating loop of IGBT 3→IGBT 2→IGBT 1→capacitor 7→coupling diode 6→IGBT 3 and the inductance of the commutating loop of IGBT 4→coupling diode 6→capacitor 8→IGBT 4 are applied to the IGBT module 3 and the IGBT 4. Therefore, by suppressing the inductances of the commutating loops, the surge voltages can be reduced.

Figure 7:
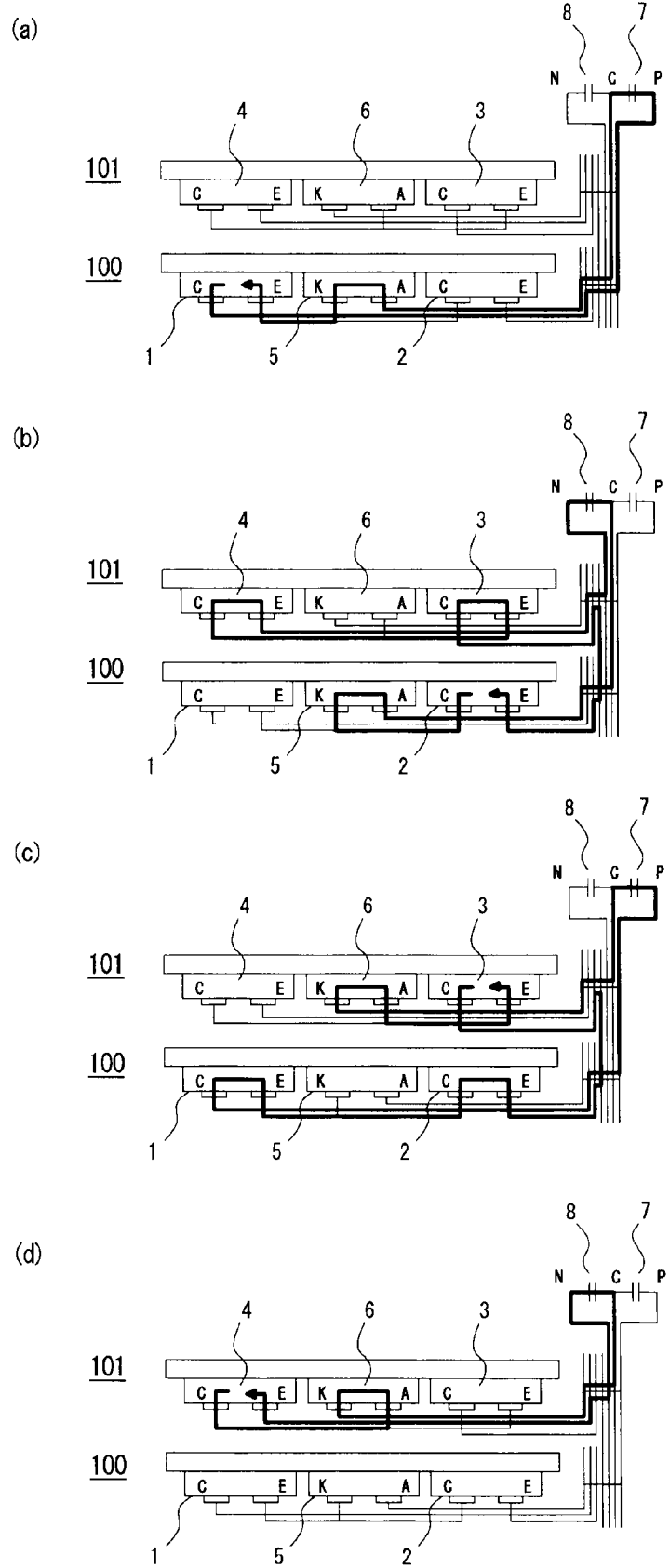
FIG. 7 is a diagram showing the commutating loop in the construction of FIG. 2.

FIG. 7 shows the commutating loop in the first embodiment. FIG. 7 is a schematic diagram which is viewed in a direction parallel to the plane of the laminated bus bar, and the commutating loop is represented by a heavy line. In this construction, the electrode position of each module is on the same plane, and thus it will be described on the basis of the diagram viewed in the direction parallel to the plane of the laminated bus bar. However, it is actually necessary to consider the connection point (P, C, N, AC in FIG. 5) of the laminated bus bars 11, 12 and the laminated bus bar 13. In order to reduce the inductance at the connection point, it is effective that P, C, N, AC are connected at many points although they are individually connected at one point in FIG. 5. The connection points are overlapped when viewed in the direction parallel to the plane of the laminated bus bar, and thus they are illustrated as being displaced in the commutating loops represented by heavy lines of FIG. 7.

FIGS. 7(a), (b), (c), (d) correspond to FIGS. 6(a), (b), (c), (d), and show the commutating loops when the IGBT module 1, the IGBT module 2, the IGBT module 3 and the IGBT 4 are switched. In order to reduce the inductance, it is necessary to reduce the area of the loop at maximum. It is found in the construction of these figures that current flows through the adjacent bus bars and thus the inductance is reduced. Furthermore, it is effective to the suppression of the inductance that the current route is shortened. In the four loops shown in the figures, the inductance is particularly liable to increase in the cases of (b), (c) where current flows through the three IGBT modules and one coupling diode module. Therefore, it is necessary to reduce these loops, and the arrangement of the elements is also important.

For example, in FIG. 7(b), when the positions of the IGBT module 1 and the coupling diode module 5 are exchanged by each other, current flows through a module farther than a capacitor in the positive side arm and the negative side arm, and thus the current route is longer. In the present arrangement, no loop in which current flows through the farthest element from the capacitor in both the positive side arm and the negative side arm exists in the loops of (b) and (c), and thus the inductance can be reduced. In the present construction, at the positive side arm, the IGBT module 1, the coupling diode module 5 and the IGBT module 2 are successively arranged so as to be farther from the capacitor in this order, and at the negative side arm, the IGBT module 4, the coupling diode module 6 and the IGBT module 3 are successively arranged so as to be farther from the capacitor in this order. However, the device may be constructed so that two modules out of the IGBT module 2, the IGBT module 3, the IGBT module 4 and the coupling diode module 5 constituting the loop of FIG. 7(b) and two modules out of the IGBT module 1, the IGBT module 2, the IGBT module 3 and the coupling diode module 6 constituting the loop of FIG. 7(c) are not disposed at the farthest position from the capacitor. That is, the IGBT module 1 and the IGBT module 4 may be located at the farthest position from the capacitor, or the coupling diode module 5 and the coupling diode module 6 may be located at the farthest position from the capacitor.

According to the above construction, the modules of the positive side arm and the modules of the negative side arm are separately cooled by the different cooling plates. Accordingly, as compared with the case where the modules of the positive side arm and the modules of the negative side arm are cooled by one cooling plate as in the case of the Patent Document 1, the cooling can be properly performed even when the loss of the modules is large or when the capacity of the cooler is deficient. Furthermore, as shown in the Patent Document 2, when the cooling plate is provided every module, or even when the cooling plates are shared to the positive side arm and the negative side arm in the Patent Document 1, there is a case where the cooling plates of the positive side arm and the negative side arm cannot be brought into close contact with each other due to the construction of the cooler (for example, fixing of a fin or a heat exchanger, a device, etc.), so that the space between the cooling plates is large and thus it becomes a dead space. Accordingly, the overall size of the device is large. In the construction of the first embodiment, the cooling plates are spaced from each other in advance because of the modulate arrangement and the insulation distance, and thus the dead space can be eliminated, so that the device can be miniaturized and reduced in weight.

In this construction, in order to secure the insulation between the cooling plate 9 and the module terminal connection portion of the negative side arm unit 101, the distance therebetween is set to be spatially long. However, the negative side arm unit 101 and the positive side arm unit 100 can be made to further approach to each other by inserting an insulating sheet into the gap between the cooling plate 9 and the module terminal connection portion of the negative side arm unit 101, whereby the distance between the negative side arm unit 101 and the positive side arm unit 100 can be made shortest and they are spaced from each other by only the distance corresponding to the thickness of the insulating sheet. In the case where plural units are further laminated to constitute 2-phase and 3-phase, the distance between the phases can be likewise reduced by inserting an insulating sheet. Furthermore, in the construction shown in FIG. 4 of the Patent Document 3, the connection portion for connecting the unit of each phase and the laminated bus bar connected to the capacitor is bent in an L-shape in both the directions, and when the thickness of the cooling plate or the module is small or when the insulating distance between units is short, the connection portions of the respective units interfere in one another, so that the units cannot be made to approach to one another. However, in this construction, with respect to the laminated bus bar 11 constituting the positive side arm and the laminated bus bar 12 constituting the negative side arm, the connecting portions thereof to the laminated bus bar 13 are bent in an L-shape in the same direction, and thus they do not interfere in each other. Therefore, the interval between the positive side arm unit 100 and the negative side arm unit 101 can be shortened, and also when 2-phase, 3-phase is constructed by further laminating plural units, the mutual distance therebetween can be shorted.

The unitization is performed every arm, and thus the dealing unit is smaller than the case where the elements of one phase are unified as in the case of the Patent Document 1, so that the dealing performance in the manufacturing process and the maintenance work can be enhanced. Furthermore, the wiring is performed by the laminated bus bar and the module arrangement is properly performed, so that the inductance can be reduced.

Second Embodiment

Figure 8:
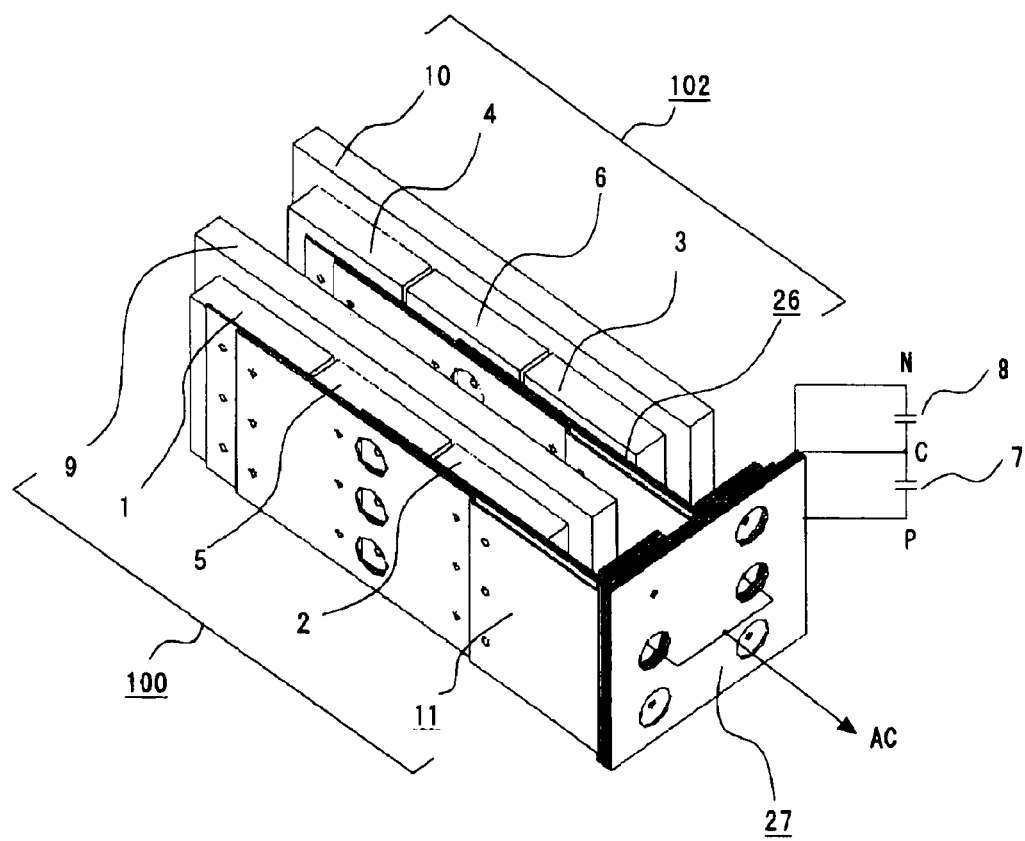
FIG. 8 is a diagram showing the construction of a power conversion device according to a second embodiment of the present invention.
Figure 9:
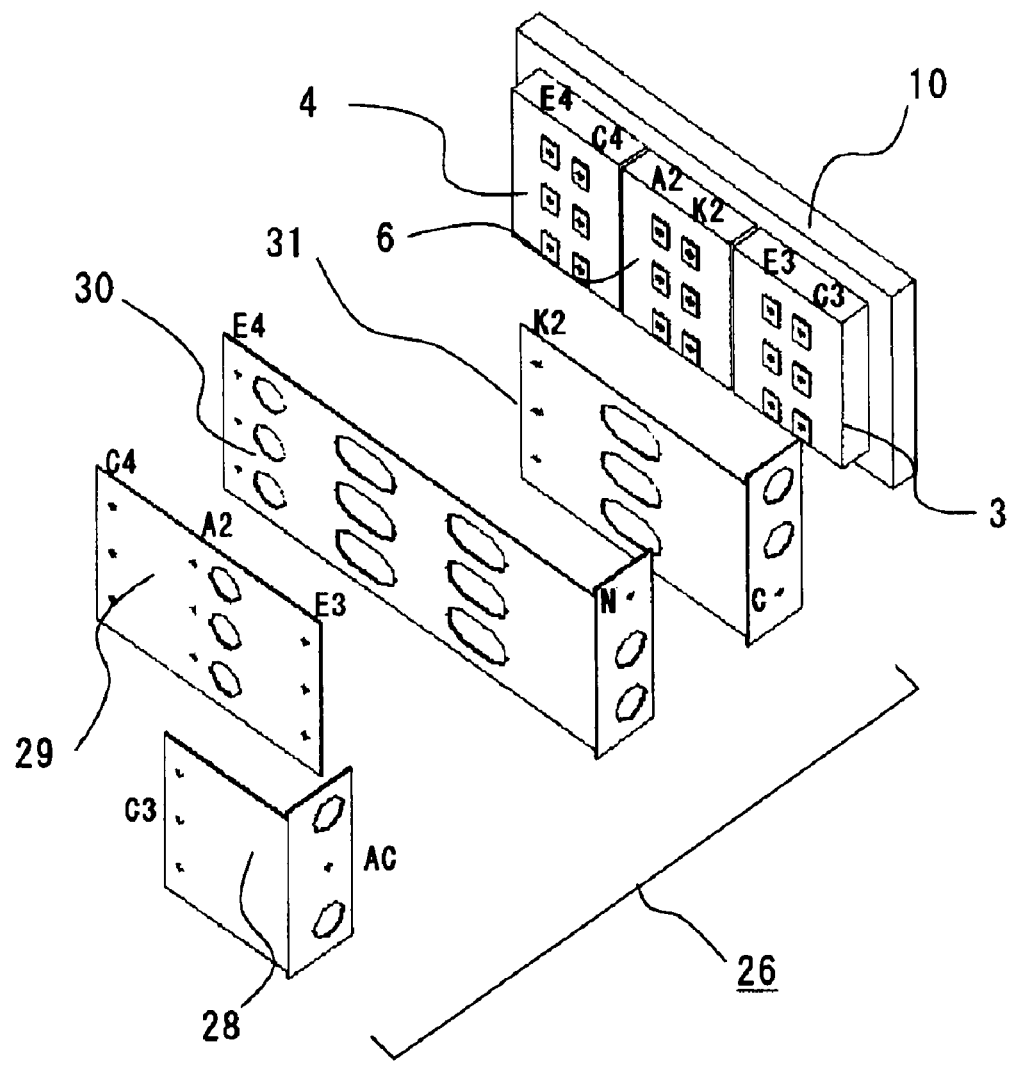
FIG. 9 is a perspective view showing the connection construction of a laminated bus bar 26 of FIG. 8.

FIG. 8 shows the construction of a power conversion device according to a second embodiment. FIG. 9 is a perspective view showing the modules 3, 4, 6 constituting the negative side arm unit 102 and the connection thereof to the laminated bus bar 26. The construction of the positive side arm unit 100 is the same as shown in FIG. 3, and thus it is omitted. In this construction, the arrangement of the respective positive and negative electrodes of the IGBT modules 3, 4 and the coupling diode module 6 of the negative side arm unit 102 is reversed. That is, the collector electrodes (C) of the IGBT modules 3, 4 and the cathode electrode (K) of the coupling diode module are constructed to be near to the capacitor. As is found from the comparison between FIGS. 3 and 9, in the above construction, the same construction as the bus bars 14 to 17 constituting the laminated bus bar 11 of the positive side arm unit 100 can be used as the construction of the bus bars 28 to 31 constituting the laminated bus bar 26 of the negative side arm unit 102, and thus the kind of the bus bars can be reduced.

Figure 10:
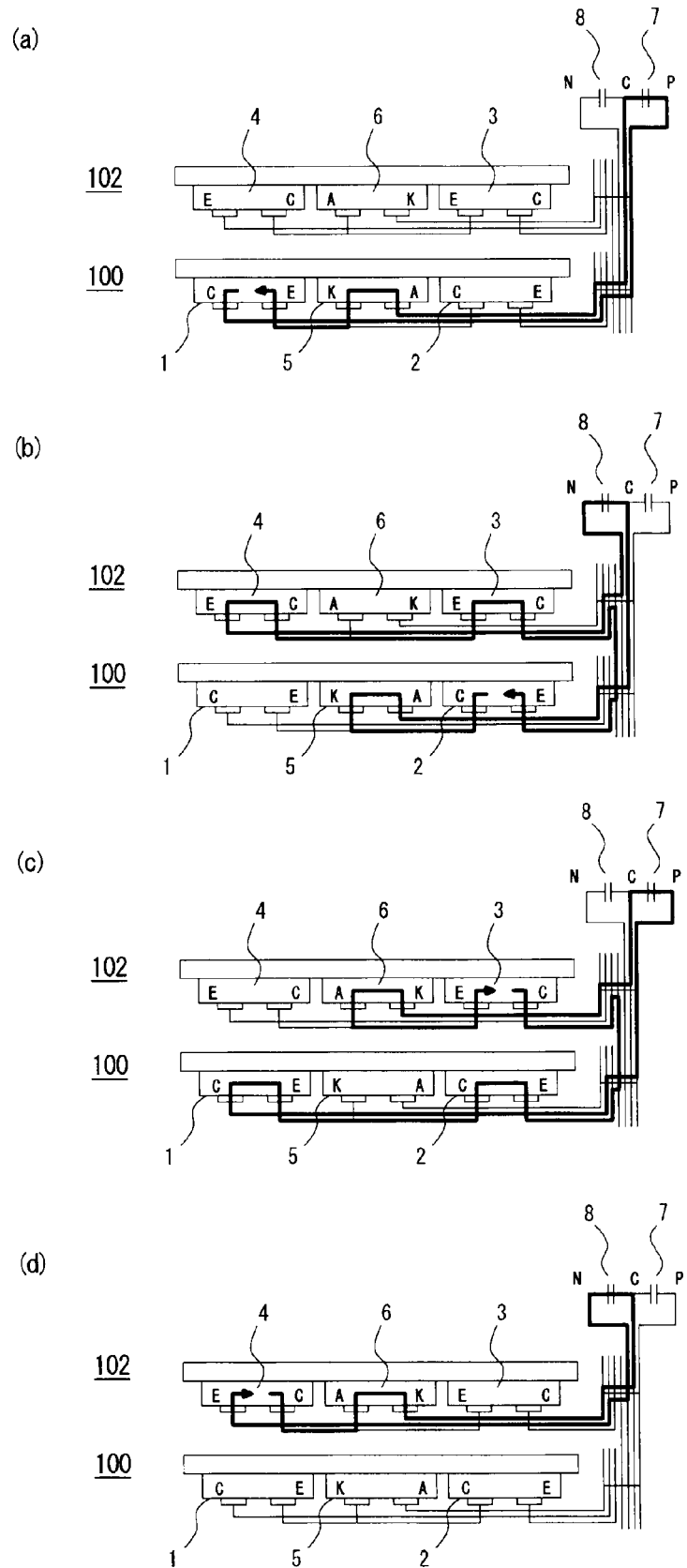
FIG. 10 is a diagram showing the commutating loop in the construction of FIG. 8.

FIG. 10 shows the commutating lop in the case of this construction. As in the case of FIG. 7, FIG. 10(a) shows a case where the IGBT module 1 is switched, FIG. 10(b) shows a case where the IGBT module 2 is switched, FIG. 10(c) shows a case where the IGBT module 3 is switched, and FIG. 10(d) shows a case where the IGBT module 4 is switched. In the case of FIG. 10(a), the same as the first embodiment is satisfied. In the case of FIG. 10(b), with respect to the route shown in FIG. 7 of the first embodiment, current flows through the route at the lower side of the IGBT module 3 in the direction of FIG. 7 three times, and thus the loop length is long. On the other hand, in the second embodiment, current flows through the route only once, and thus the inductance can be reduced. Furthermore, in the case of FIG. 10(c), the frequency at which current passes over the lower side of the IGBT module 3 is likewise smaller, and in the case of FIG. 10(d), the frequency at which current passes over the lower side of the coupling diode module 6 is smaller, so that the loop length is shortened and the inductance can be suppressed.

As described above, in the construction of the second embodiment, the arrangement of the positive and negative electrodes of the modules of the negative arm unit is reversed. Therefore, the bus bars connected to the positive side arm and the bus bars connected to the negative side arm can be designed to have the same shape, and the kinds of the bus bars can be reduced. Furthermore, the loop length of the commutating route can be shortened, and the inductance of the main circuit can be suppressed.

In the second embodiment, all the modules of the negative side arm are reversed, however, the effect of suppressing the inductance can be obtained even when only the IGBT module 3 or only the coupling diode module 6 is reversed, for example.

Third Embodiment

Figure 11:
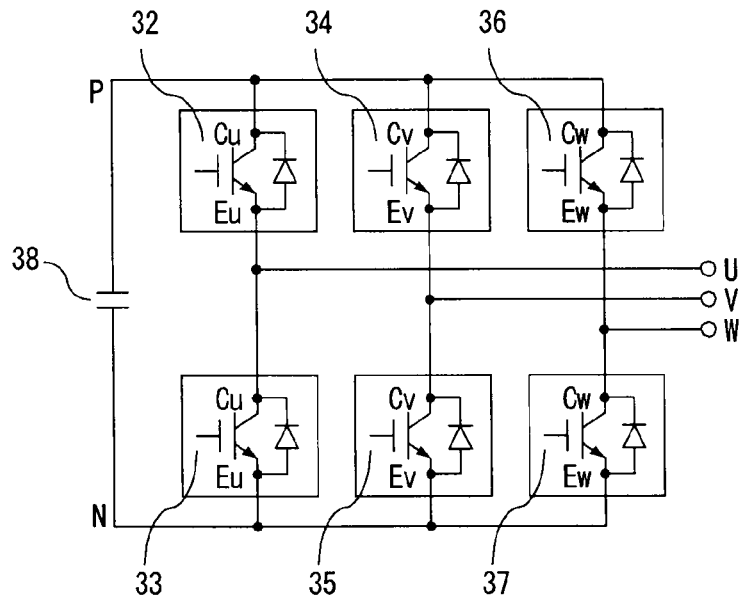
FIG. 11 is a circuit diagram showing a power conversion device according to a third embodiment of the present invention.

FIG. 11 is a circuit diagram showing a power conversion device according to a third embodiment. The third embodiment relates to a 2-level power conversion device used for power conversion between a DC power source having two potentials of positive pole (P) and negative pole (N) and alternating current. The alternating current side has three phases of U-phase, V-phase and W-phase. IGBT modules 32, 34, 36 and IGBT modules 33, 35, 37 serving as switching elements as semiconductor elements are connected to one another in series between the positive pole (P) and the negative pole (N) with respect to each of the U, V, W phases, the connection points between the IGBT modules 32, 34, 36 and the IGBT modules 33, 35, 37 are connected to the alternating current terminal (U, V, W) side. A capacitor 38 constitutes a DC power source, and has a terminal for outputting current to the positive pole (P) and the negative pole (N).

Figure 12:
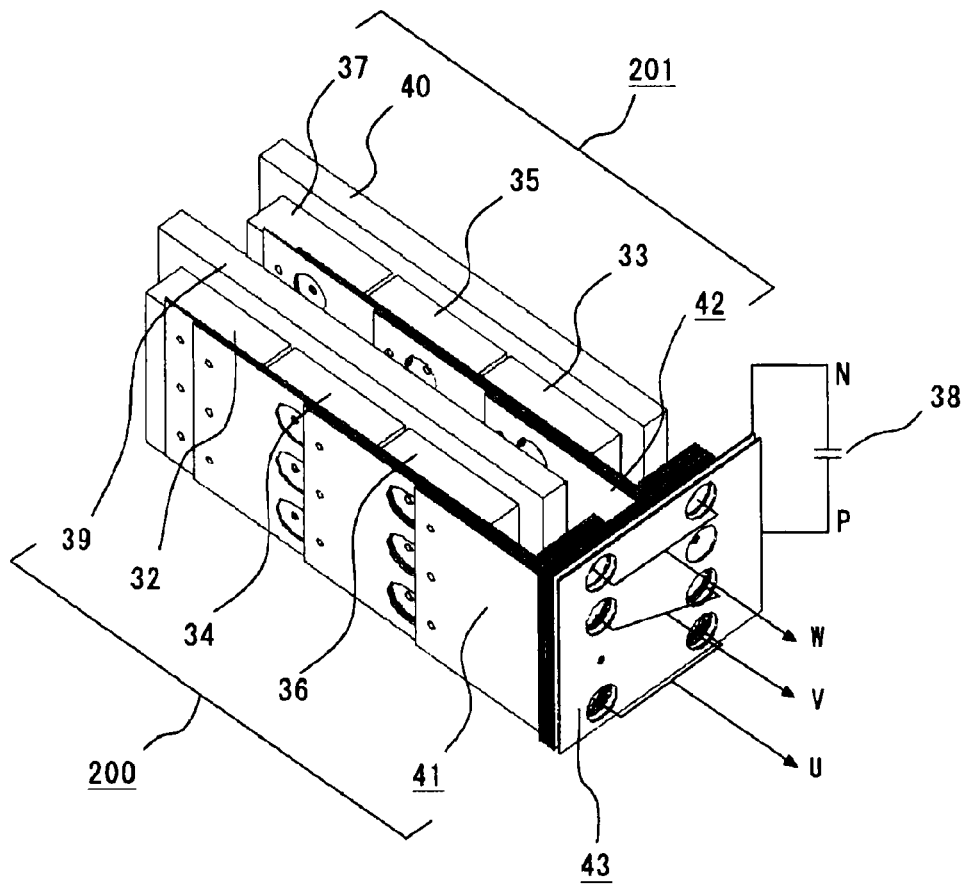
FIG. 12 is a diagram showing the construction of the power conversion device according to the third embodiment of the present invention.

FIG. 12 shows the construction of the power conversion device according to the third embodiment. FIG. 12 shows the 2-level power conversion device for three phases, and it is comprises a positive side arm unit 200, a negative side arm unit 201, a third laminated bus bar 43 and a capacitor 38. The positive side arm unit 200 comprises a U-phase IGBT module 32, a V-phase IGBT module 34, a W-phase IGBT module 36, a first cooling plate 39 on which the respective modules are mounted, and a first laminated bus bar 41 connected to each module, and the negative side arm unit 201 comprises a U-phase IGBT module 33, a V-phase IGBT module 35, a W-phase IGBT module 37, a second cooling plate 40 connected to the respective modules and a second laminated bus bar 42 connected to each module. The modules of the positive side arm unit 200 are successively arranged in the order of the U phase, the V phase and the W phase which are farther from the capacitor 38. On the other hand, the modules of the negative side arm unit 201 are successively arranged in the order of the W phase, the V phase and the U phase which are farther from the capacitor 38 in this order.

The positive side arm unit 200 and the negative side arm unit 201 are disposed to be laminated so that the cooling plates 39 and 40 are parallel to each other and the modules are mounted on the same planes of the cooling plates 39, 40, and the cooling plate 39 and the module terminal connection portion of the negative side arm unit 201 are spaced from each other so that a proper insulating distance is set between them. The cooling plates 39, 40 are used to radiate heating of the modules to the outside, and circulation of liquid, boiling or the like is utilized. Furthermore, in this construction, three modules are mounted on one cooling plate, however, the cooling plate may be provided every element as in the case of the Patent Document 2.

The positive side arm unit 200 and the negative side arm unit 201 are electrically connected to each other by a laminated bus bar 43. The laminated bus bar 43 is obtained by laminating bus bars formed of planar electrical conductors so that an insulating material is sandwiched between the bus bars.

Figure 13:
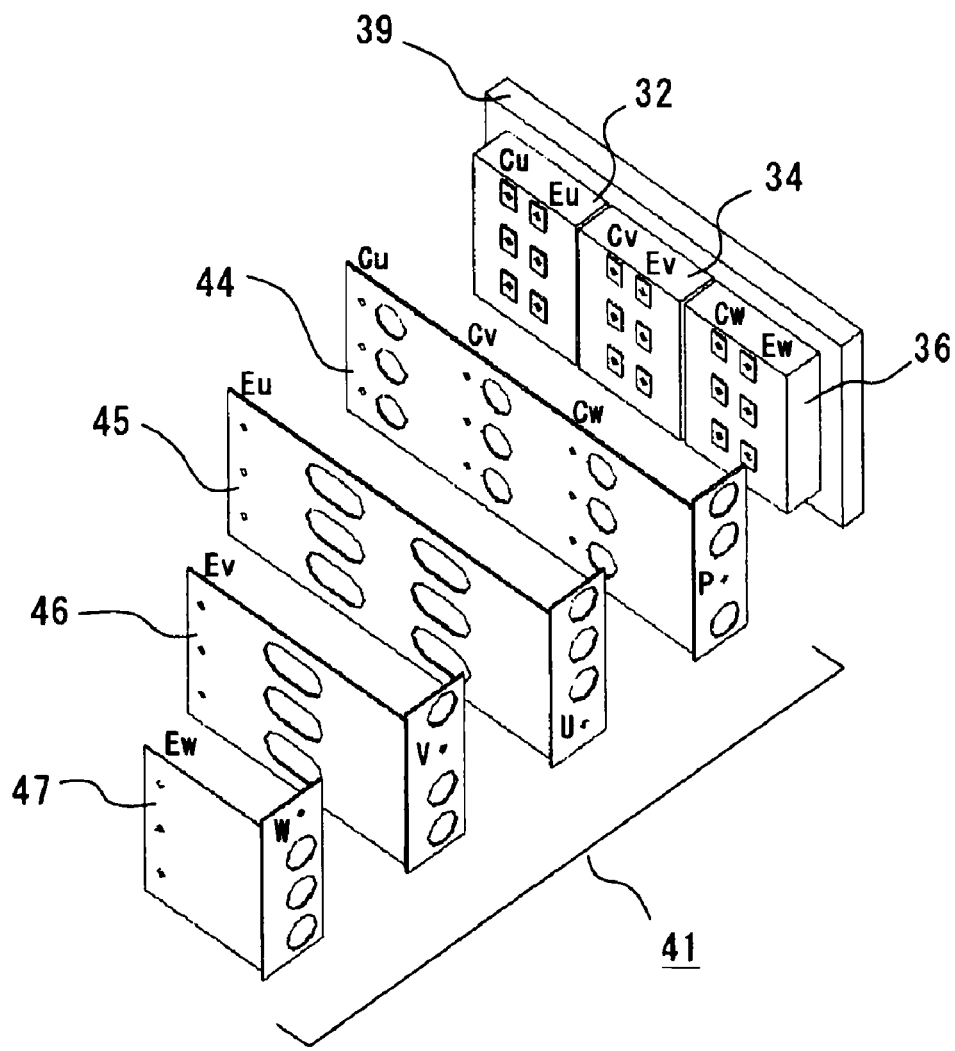
FIG. 13 is a perspective view showing the connection construction of a laminated bus bar 41 of FIG. 12.

Next, the structure and the connection construction of the laminated bus bars 41, 42, 43 will be described in detail with reference to FIGS. 13 to 15. FIG. 13 is a perspective view showing the connection of the modules 32, 34, 36 and the laminated bus bar 41 constituting the positive side arm unit 200, and the bus bars are illustrated as being spaced from each other. The laminated bus bar 41 leads the potential of each of the modules 32, 34, 36 of the positive side arm unit 200 to the connection portion which is located so as to connect the potential to the DC power source (in the right and front side direction in FIG. 13), and it is constructed by laminating the bus bars 44, 45, 46, 47. The bus bars 44, 45, 46, 47 connected to the laminated bus bar 43 are bent at a right angle at the connection portion and formed in an L-shape.

The bus bar 44 is a bus bar connected to the positive pole (P), and connected to the collector electrodes (Cu, Cv, Cw) of the IGBT modules 32, 34, 36 of the positive side arm of the U, V, W phase. The bus bars 45, 46, 47 are connected to the alternating current terminals (U, V, W) respectively, and connected to the emitter electrodes (Eu, Ev, Ew) of the IGBT modules 32, 34, 36.

Figure 14:
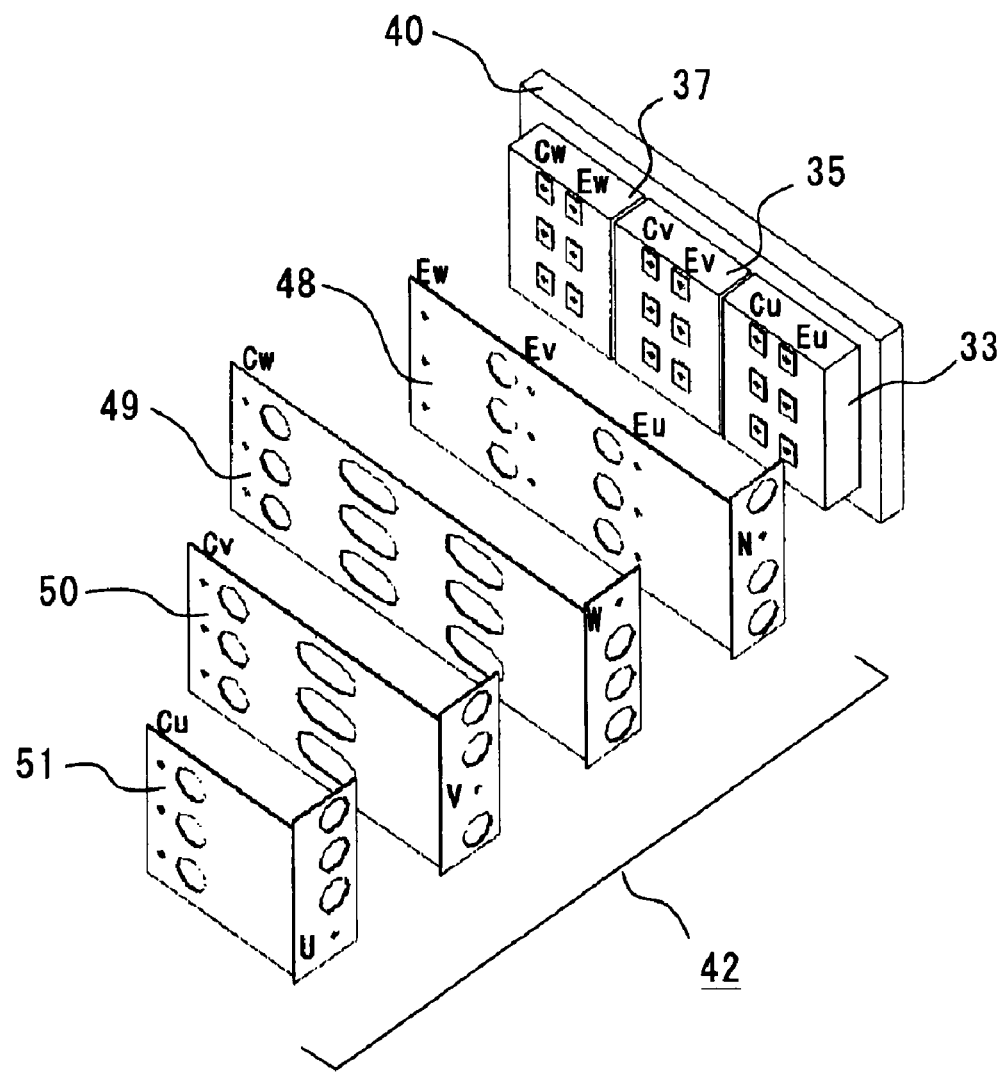
FIG. 14 is a perspective view showing the connection construction of the laminated bus bar 42 of FIG. 12.

FIG. 14 is a perspective view showing the connection between the modules 33, 35, 37 constituting the negative side arm unit 201 and the laminated bus bar 42, and the bus bars are illustrated as being spaced from each other. The laminated bus bar 42 leads the potential of each of the modules 37, 35, 33 of the negative side arm unit 201 to the connection portion which is located so as to connect the potential to the DC power source (in the right and front side direction in FIG. 14), and it is constructed by laminating the bus bars 48, 49, 50, 51. The bus bars 48, 49, 50, 51 connected to the laminated bus bar 43 are bent at a right angle in the same direction as the laminated bus bar 41 of the positive side arm unit 200 at the connection portion and formed in an L-shape.

The bus bar 48 is a bus bar connected to the negative pole (N), and it is connected to the emitter electrodes (Eu, Ev, Ew) of the IGBT modules 33, 35, 37 of the negative side arm of the U, V, W phases. The bus bars 49, 50, 51 are connected to the alternating current terminals (W, V, U) respectively, and connected to the collectors (Cw, Cv, Cu) of the IGBT modules 37, 35, 33.

Figure 15:
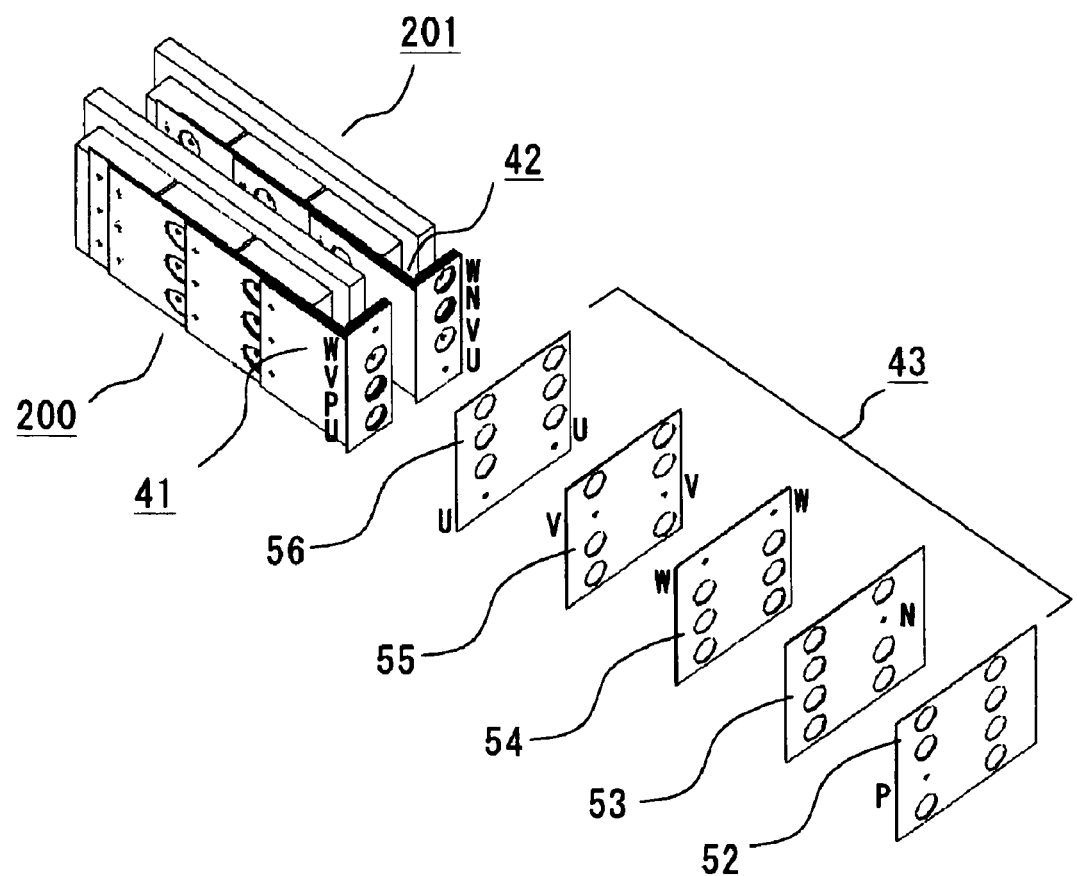
FIG. 15 is a perspective view showing the connection construction of a laminated bus bar 43 of FIG. 12.

FIG. 15 is a perspective view showing the connection of the positive side arm unit 200, the negative side arm unit 201 and the laminated bus bar 43. The laminated bus bar 43 is designed in a planar shape so as to be parallel to the connection portion of the laminated bus bars 41, 42, and it is constructed by bus bars 52 to 56.

The bus bar 52 is connected to the positive pole connection portion (P) of the laminated bus bar 41, and the bus bar 53 is connected to the negative pole connection portion (N) of the laminated bus bar 42. Furthermore, as shown in FIG. 12, the bus bar 52 is connected to the positive pole (N) of the capacitor 38, and the bus bar 53 is connected to the negative pole (N). The bus bars 54, 55, 56 connect the alternating current connection portions (U, V, W) of the laminate bus bar 41 and the laminated bus bar 42, and current is output to the alternating terminals (U, V, W) as shown in FIG. 12. In FIG. 12, current is output to the alternating current terminals (U, V, W) by the alternating current connection portions of the laminated bus bars 41, 42 and the bus bar 43, however, a terminal for outputting current to the alternating current terminal (AC) may be separately provided to the bus bars 54, 55, 56.

Figure 16:
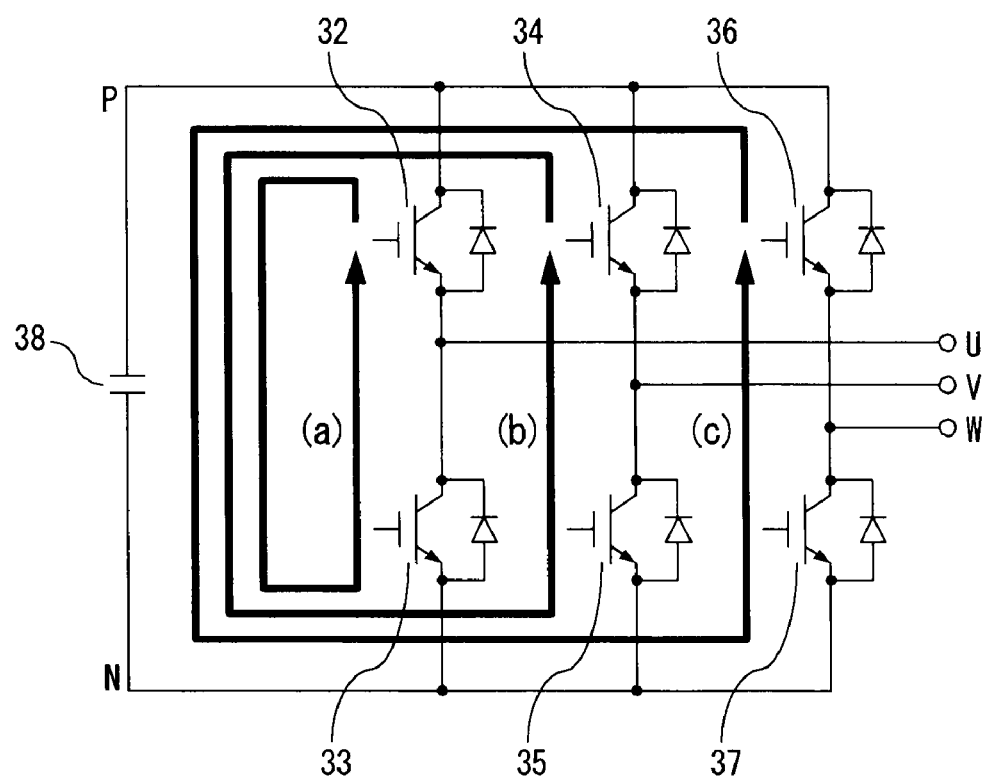
FIG. 16 is a circuit diagram showing the commutating loop in FIG. 11.

FIG. 16 shows a circuit for generating commutating loops of a 3-phase 2-level power conversion device. The commutating loops of U-phase, V-phase and W-phase are represented by (a), (b) and (c). In the 2-level power conversion device, when the IGBT modules 32, 34, 36 of the positive side arm are turned off to commutate current to the diodes of the IGBT modules 33, 35, 37 of the negative side arm, surge voltages occur in the commutating loops of IGBT modules 32, 34, 36→capacitor 38→IGBT modules 33, 35, 37→IGBT modules 32, 34, 36 as indicated by arrows in FIG. 16. Therefore, it is necessary to suppress the inductance of the commutating loops. When the IGBT modules of the negative side arm are turned off, the same occurs in the loops out of the modules although there are differences as to whether current passes through IGBT or the diode and whether a surge voltage is applied to the positive side or negative side of the IGBT module.

Figure 17:
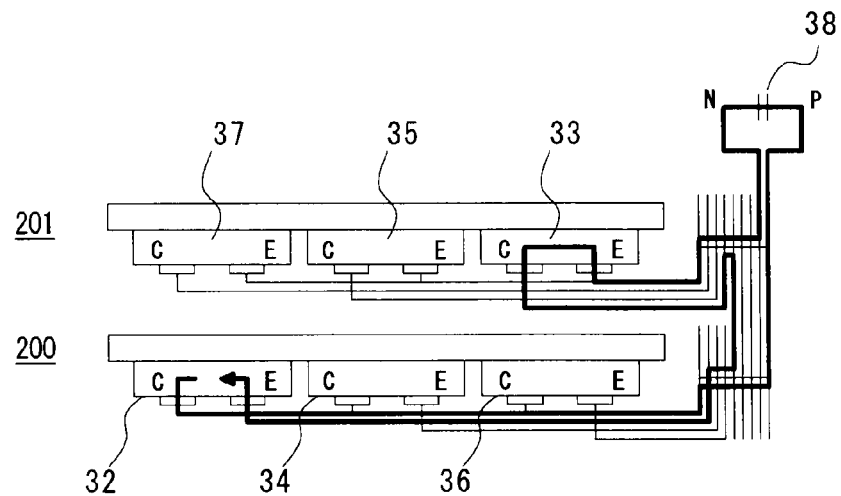
FIG. 17 is a diagram showing the commutating loop in the construction of FIG. 12.
Figure 17:
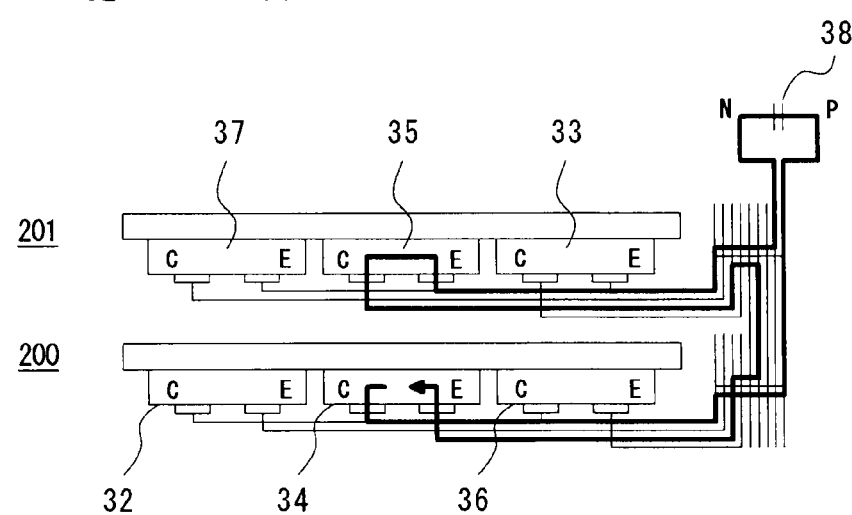
Figure 17:
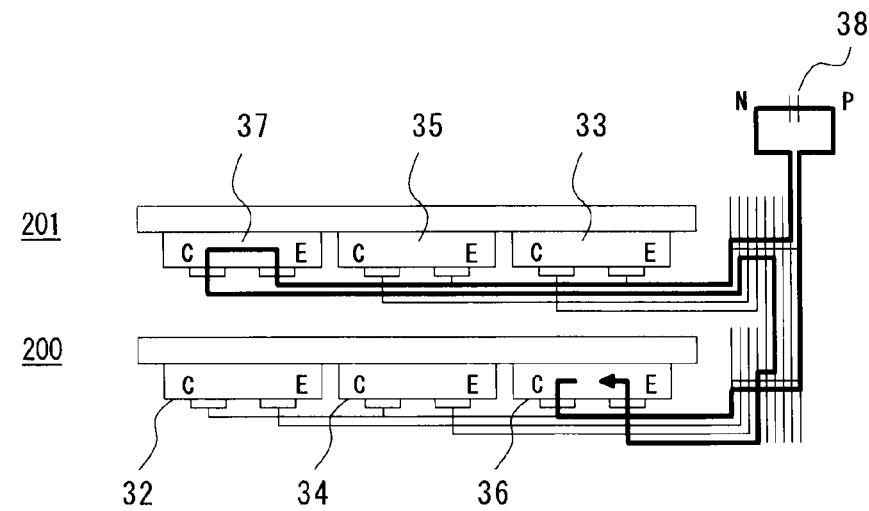

FIG. 17 shows the commutating loops of the third embodiment. FIG. 17 is a schematic diagram viewed in a direction parallel to the plane of the laminated bus bar, and the commutating lops are represented by heavy lines. FIG. 17(a) shows the commutating loop of U-phase, FIG. 17(b) shows the commutating loop of V-phase, and FIG. 17(c) shows the commutating loop of W-phase. The laminated bus bar is used as the bus bars, and thus current passes between proximate bus bars, so that the area of the loop is small and thus the inductance is suppressed. Furthermore, in this construction, with respect to the arrangement of the IGBT module, the U-phase, the V-phase and the W-phase are successively arranged so as to be farther from the capacitor side in this order in the positive side arm unit 200, and the W-phase, the V-phase and the U-phase are successively arranged so as to be farther from the capacitor side in this order in the negative side arm unit 201. Therefore, the loop length is substantially equal among the U-phase, the V-phase and the W-phase, and thus the inductance can be set to be substantially equal among them. Furthermore, the inductance can be reduced more remarkably as compared with the case where the modules of the U-phase are arranged so as to be farthest from the capacitor in both the positive side arm and the negative side arm.

In the third embodiment, as in the case of the second embodiment, if the modules of the positive side arm unit 200 or the negative side arm unit 201 are reversed so that the arrangement of the collector electrode and the emitter electrode is reversed and properly connected to the laminated bus bar 43, the laminated bus bar 41 and the laminated bus bar 42 can be designed in the same shape.

As described above, the modules of the positive side arm and the modules of the negative side arm are cooled by different cooling plates. Therefore, as compared with the case where all the modules of the positive side and negative side arms are cooled by one cooling plate as in the case of the Patent Document 1, the modules can be properly cooled even when the module loss is large or the capacity of the cooler is deficient. Furthermore, in the construction disclosed in the Patent Document 2, there is a case where the cooling plates of the positive side arm and the negative side arm cannot be brought into close contact with each other due to the construction of the cooler (for example, fixing of a fin or a heat exchanger, a device, etc.), so that the space between the cooling plates is large and thus it becomes a dead space. Accordingly, the overall size of the device is large. In the construction of the third embodiment, the cooling plates are spaced from each other in advance because of the modulate arrangement and the insulation distance, and thus the dead space can be eliminated, so that the device can be miniaturized and reduced in weight.

Furthermore, the unitization is performed every arm, so that the dealing unit is small and thus the dealing performance in the manufacturing process and the maintenance work can be enhanced. Not the phase-based unitization as disclosed in the Patent Document 3, but the arm-based unitization can be performed and it is not necessarily required that the modules of the positive side and negative side arms are adjacent to each other, so that the degree of freedom of the device construction is enhanced. In the third embodiment, the construction for the three phases is shown. However, a device for one phase may be freely constructed by providing one module in each of the positive side arm and the negative side arm, or a device for two phases may be freely constructed by providing two modules in each of the positive side arm and the negative side arm. Furthermore, the wiring is performed by the laminated bus bar, and the inductance can be lowered. Still furthermore, the modules of the positive side and negative side arms of the U-phase, V-phase and W-phase are properly arranged, so that the inductance can be lowered.

Fourth Embodiment

Figure 18:
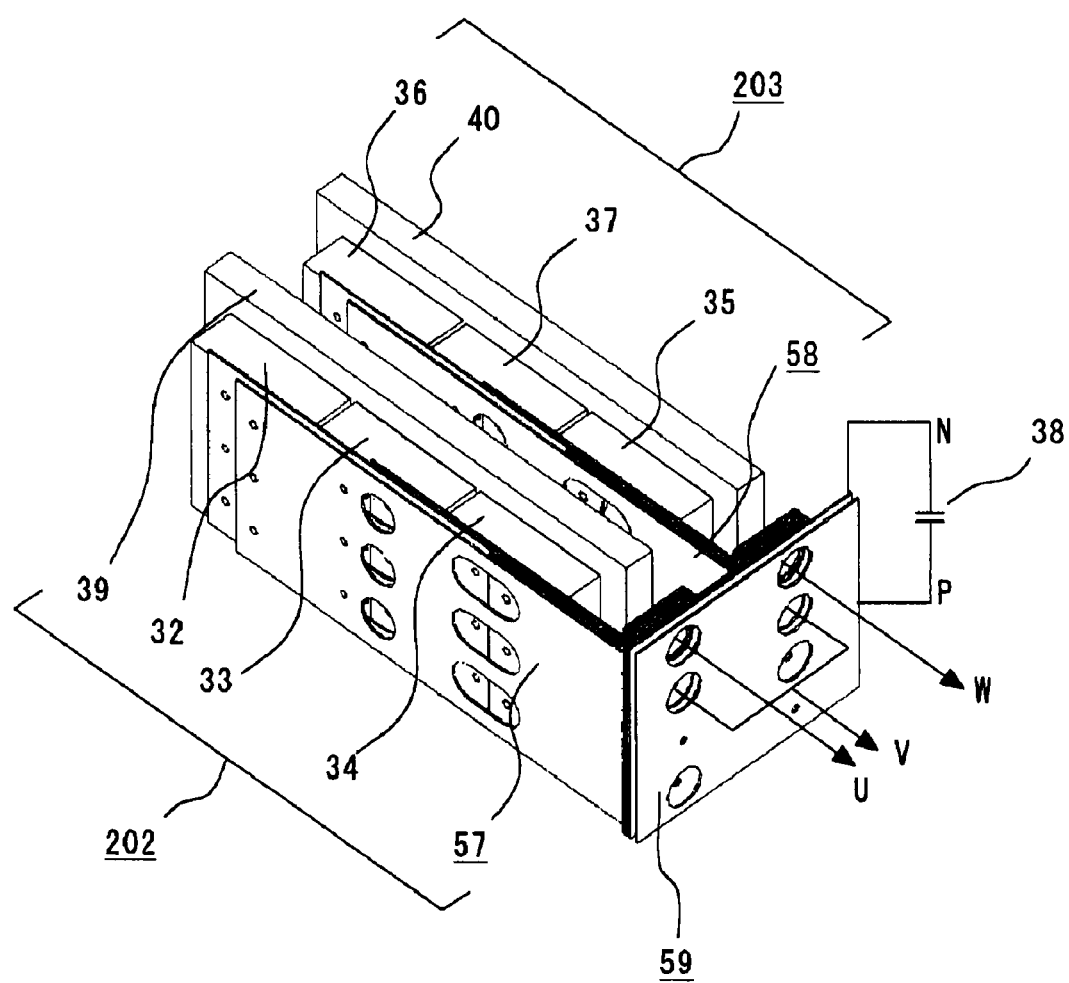
FIG. 18 is a diagram showing the construction of a power conversion device according to a fourth embodiment of the present invention.

FIG. 18 shows the construction of a power conversion device according to a fourth embodiment. As in the case of the third embodiment, the fourth embodiment relates to a 3-phase 2-level power conversion device. In the third embodiment, the IGBT modules of the positive side arm and the negative side arm are secured to the different cooling plates in all the U-phase, the V-phase and the W-phase. In this construction, the IGBT modules of the positive side arm and the negative side arm of only the V-phase are mounted on different cooling plates. Accordingly, a unit 202 is constructed by the IGBT module 32 of the positive side arm, the IGBT module 33 of the negative side arm of the U phase, the IGBT module 34 of the V-phase positive side arm, the cooling plate 39 on which these modules are mounted, and a laminated bus bar 57 connected to each module, and a unit 203 is constructed by the IGBT module 35 of the V-phase negative side arm, the IGBT module 36 of the W-phase positive side arm, the IGBT module 37 of the W-phase negative side arm, the cooling plate 40 on which these modules are mounted and a laminated bus bar 58 connected to each module. The units 202 and 203 are electrically connected to each other by the laminated bus bar 59.

Figure 19:
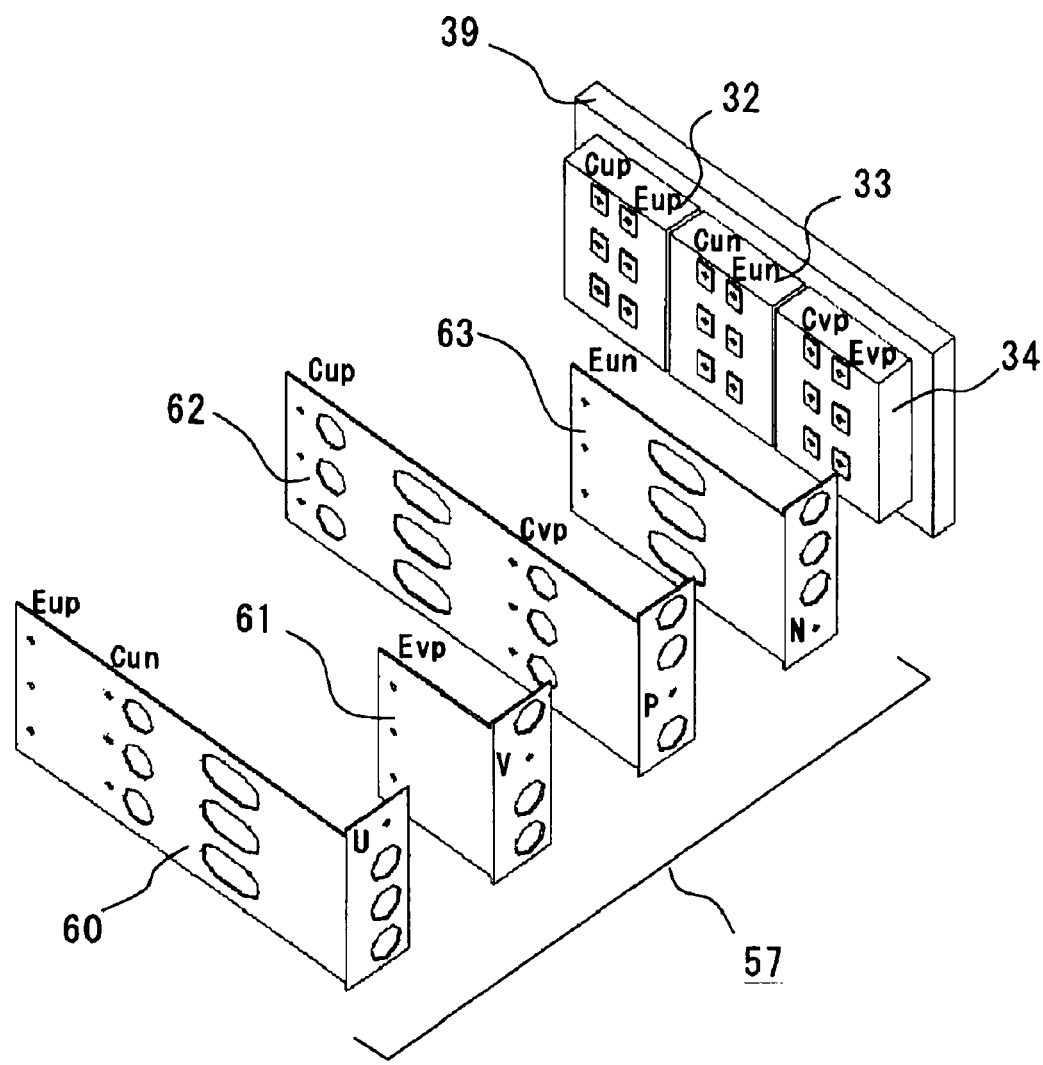
FIG. 19 is a perspective view showing the connection construction of a laminated bus bar 57 of FIG. 18.

Next, the structure and connection construction of the laminated bus bars 57, 58, 59 will be described in detail with reference to FIGS. 19 to 21. FIG. 19 is a perspective view showing the connection of the IGBT modules 32, 33, 34 of the unit 202 and the laminated bus bar 57, and the bus bars are illustrated as being spaced from one another. The laminated bus bar 57 is constructed by bus bars 60 to 63, and it is bent at a right angle in an L-shape at the connection portion located at the right and front side of FIG. 19 as in the above-described embodiments.

The collector electrodes (Cup, Cvp) of the IGBT module 32 of the U-phase positive side arm and the IGBT module 34 of the V-phase positive side arm are connected to the bus bar 62 connected to the positive pole (P). The emitter electrode (Eup) of the IGBT module 32 of the U-phase positive side arm and the collector electrode (Cun) of the IGBT module 33 of the U-phase negative side arm are connected to the bus bar 60, and connected to the alternating current terminal (U). The emitter electrode (Eun) of the IGBT module 33 of the U-phase negative side arm is connected to the bus bar 63 connected to the negative pole (N). The emitter electrode (Evp) of the IGBT module 34 of the V-phase positive side arm is connected to the bus bar 61 connected to the alternating current terminal (V).

Figure 20:
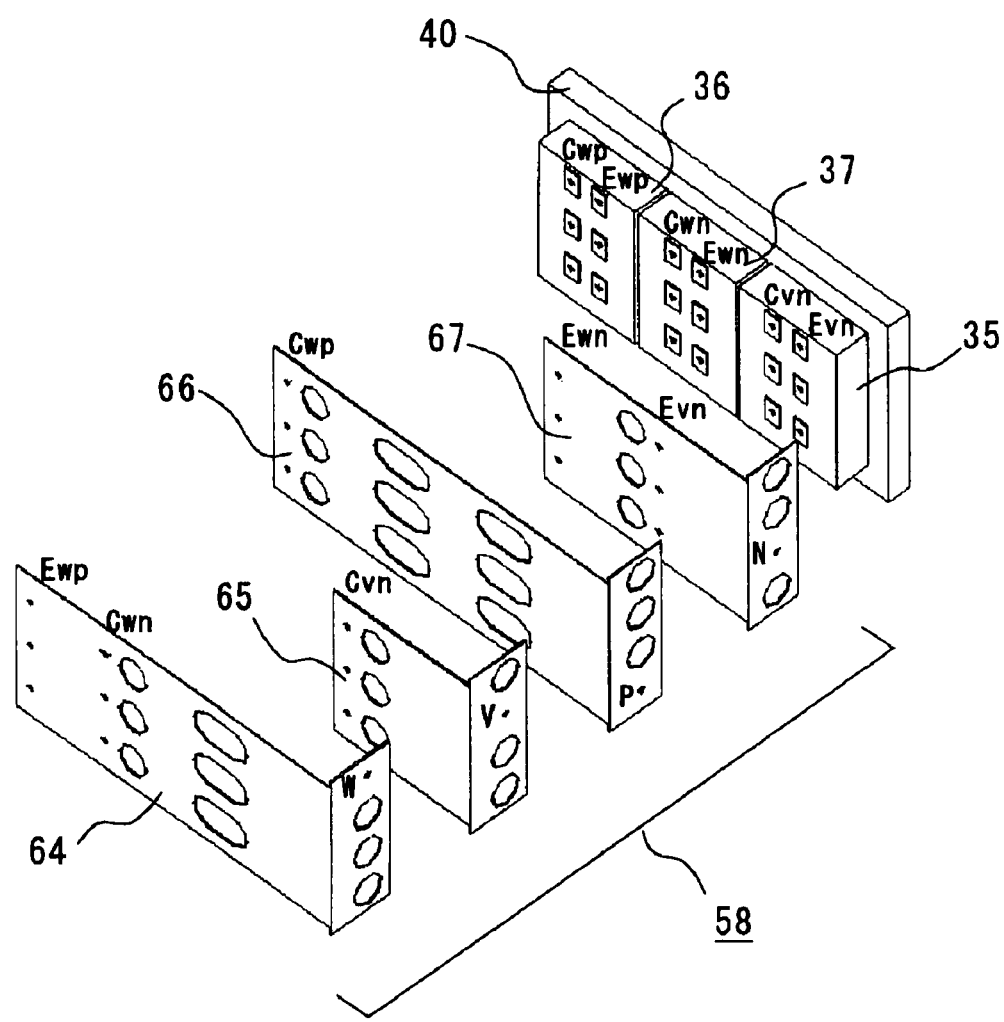
FIG. 20 is a perspective view showing the connection construction of a laminated bus bar 58 of FIG. 18.

FIG. 20 is a perspective view showing the connection of the IGBT modules 35, 36, 37 and the laminated bus bar 58 of the unit 203, and the bus bars are illustrated as being spaced from one another. The laminated bus bar 58 is constructed by bus bars 64 to 67, and it is bent at a right angle in an L-shape at the connection portion located at the right and front side of FIG. 20 as in the case of the above-described embodiments.

The collector electrode (Cwp) of the IGBT module 36 of the W-phase positive side arm is connected to the bus bar 66 connected to the positive pole (P). The emitter electrode (Ewp) of the IGBT module 36 of the W-phase positive side arm and the collector electrode (Cwn) of the IGBT module 37 of the W-phase negative side arm are connected to the bus bar 64, and connected to the alternating current terminal (W). The emitter electrode (Ewn) of the IGBT module 37 of the W-phase negative side arm and the emitter electrode (Evn) of the IGBT module 35 of the V-phase negative side arm are connected to the bus bar 67 having a connection terminal to the negative pole (N). The collector electrode (Cvn) of the IGBT module 35 of the V-phase negative side arm is connected to the bus bar 65 connected to the alternating current terminal (V).

Figure 21:
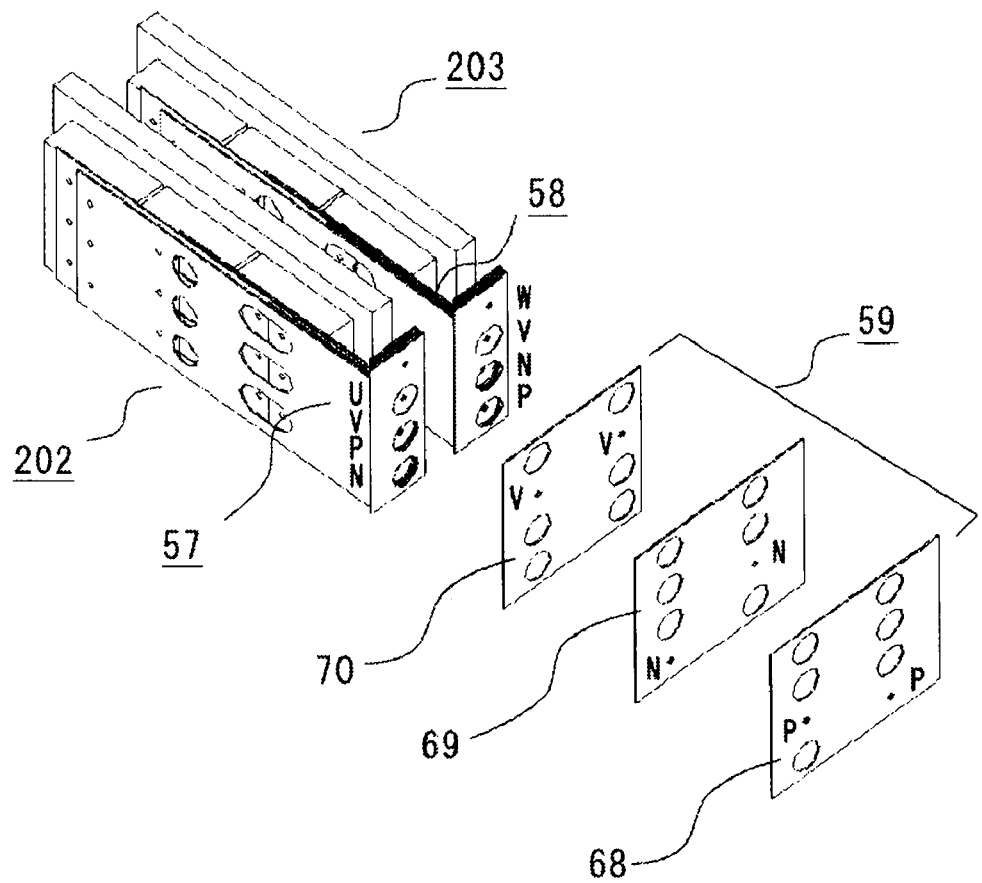
FIG. 21 is a perspective view showing the connection construction of a laminated bus bar 59 of FIG. 18.

FIG. 21 is a perspective view showing the connection of the unit 202, the unit 203 and the laminated bus bar 59. The laminated bus bar 59 is constructed by laminating the bus bars 68, 69, 70. The bus bars 68, 69 are connected to the positive pole connection portion (P) and the negative pole connection portion (N) of the laminated bus bar 57 and the laminated bus bar 58. Furthermore, as shown in FIG. 18, the bus bar 68 is connected to the positive pole (P) of the capacitor 38, and the bus bar 69 is connected to the negative pole (N). The bus bar 70 is a bus bar for connecting the alternating connection portions (V) of the laminated bus bar 57 and the laminated bus bar 58, and current is output to the alternating current terminal (V) as shown in FIG. 18. Furthermore, with respect to the U-phase and the V-phase, current is output to the alternating current terminals (U, W) without being connected to the laminated bus bar 59. In FIG. 18, current is output to the alternating current terminal (V) by the alternating connection portions of the laminated bus bars 57, 58 and the bus bar 70, however, a terminal for outputting current to the alternating current terminal (AC) may be separately provided to the bus bar 70.

Figure 22:
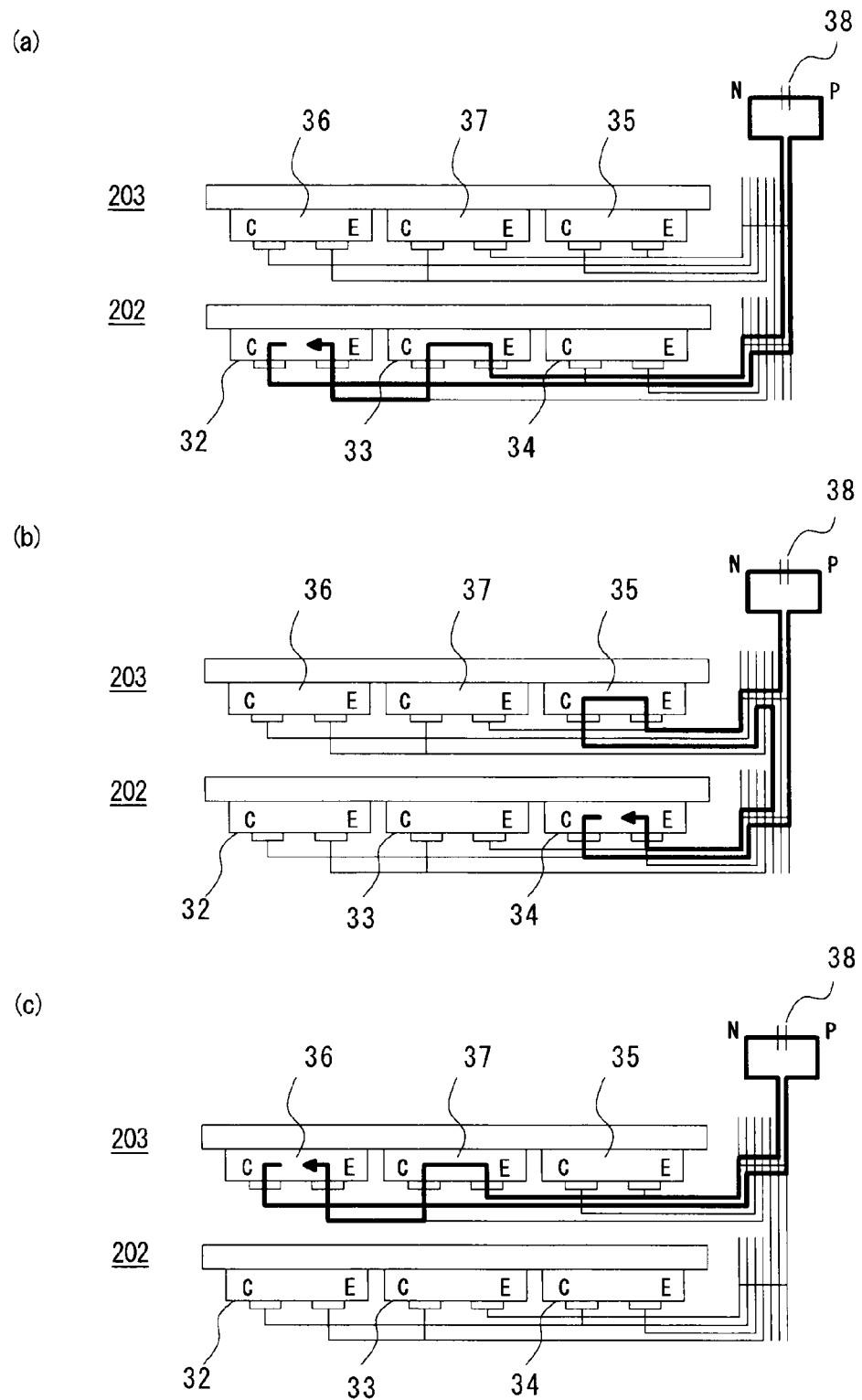
FIG. 22 is a diagram showing the commutating loop in the construction of FIG. 18.

FIG. 22 shows the commutating loop of the fourth embodiment. FIGS. 22(*a*), (*b*), (*c*) correspond to the commutating loops of FIG. 16, and show the U-phase, the V-phase and the W-phase respectively. In this construction, unlike the third embodiment, the loops of the U-phase(a) and the W-phase(c) pass over the connection portion between the laminated bus bar and the laminated bus bar only twice. In general, the connection portion between the laminated bus bar and the laminated bus bar is apt to have large inductance. Therefore, in this construction, the inductances of the U-phase and the W-phase can be reduced. Furthermore, with respect to the V-phase(b), the loop passes over the connection between the laminated bus bar and the laminated bus bar four times as in the case of the third embodiment. However, the IGBT module 34 of the V-phase positive side arm and the IGBT module 35 of the V-phase negative side arm are disposed to be nearest to the capacitor connection portion, so that the loop length is shortened and the inductance can be reduced.

As in the case of the above-described second and third embodiments, in the fourth embodiment, if the modules connected to the cooler 39 or 40 is reversed so that the arrangement of the collector electrode and the emitter electrode is reversed and are properly connected to the laminated bus bar 59, the laminated bus bar 57 and the laminated bus bar 58 can be designed in the same shape.

As described above, the modules of the U-phase positive and negative side arms and the V-phase positive side arm and the modules of the V-phase negative side arm and the W-phase positive and negative side arms are cooled by different cooling plates. Therefore, as compared with the case where all the modules of the positive and negative side arms are cooled by one cooling plate as in the case of the Patent Document 1, the cooling can be properly performed even when the module loss is large or the capacity of the cooler is deficient. Furthermore, in the construction disclosed in the Patent Document 2, there is a case where the cooling plates of the positive side arm and the negative side arm cannot be brought into close contact with each other due to the construction of the cooler (for example, fixing of a fin or a heat exchanger, a device, etc.), so that the space between the cooling plates is large and thus it becomes a dead space. Accordingly, the overall size of the device is large. In the construction of the fourth embodiment, the cooling plates are spaced from each other in advance because of the modulate arrangement and the insulation distance, and thus the dead space can be eliminated, so that the device can be miniaturized and reduced in weight.

Furthermore, the unitization is performed between the U-phase and the positive side arm of the V-phase and between the negative side arm of the V-phase and the W-phase, so that the dealing unit is small and thus the dealing performance in the manufacturing process and the maintenance work can be enhanced. Not the phase-based unitization as disclosed in the Patent Document 3, but the unitization is performed between the U-phase and the positive side arm of the V-phase and between the negative side arm of the V-phase and the W-phase, so that the degree of freedom of the device construction is enhanced. Furthermore, the wiring is performed by the laminated bus bar, and the inductance can be lowered.

As compared with the third embodiment, the IGBT modules of the positive and negative side arms of only the V-phase are mounted on different cooling plates, and thus the bus bars 56, 54 for connecting the positive and negative side arms of the U-phase and the W-phase shown in the third embodiment are not required, so that the number of bus bars can be reduced. Furthermore, the number of the connection points between the laminated bus bars in the U-phase and the W-phase is reduced, so that the inductance can be reduced. Still furthermore, the IGBT modules of the V-phase are disposed to be nearest to the capacitor, so that the inductance can be reduced.

Fifth Embodiment

Figure 23:
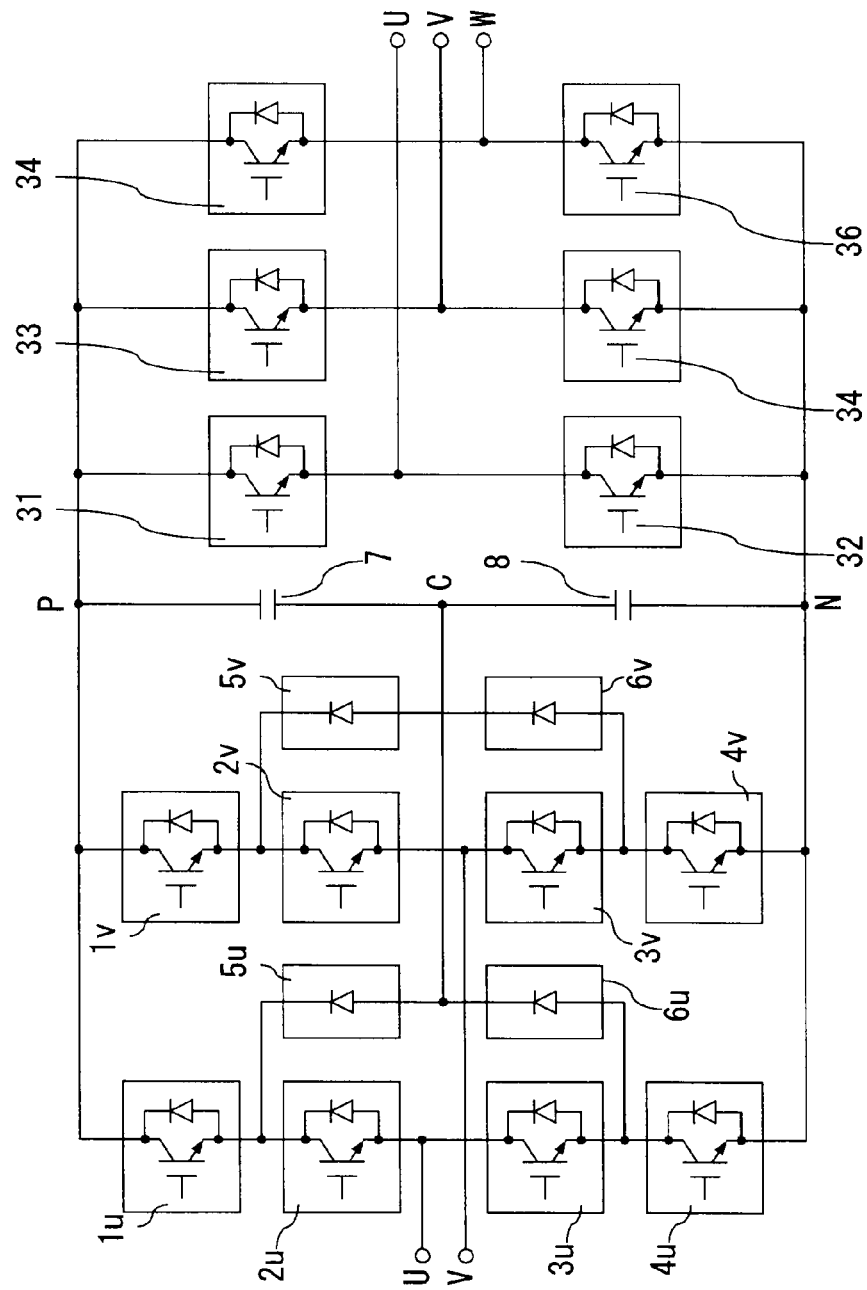
FIG. 23 is a circuit diagram showing a power conversion device according to a fifth embodiment of the present invention.

FIG. 23 is a circuit diagram showing a fifth embodiment. A converter-inverter for performing power conversion of single-phase alternating current—direct current—3-phase alternating current is constructed by using 3-level power conversion devices for two phases and a 3-phase 2-level power conversion device.

Figure 24:
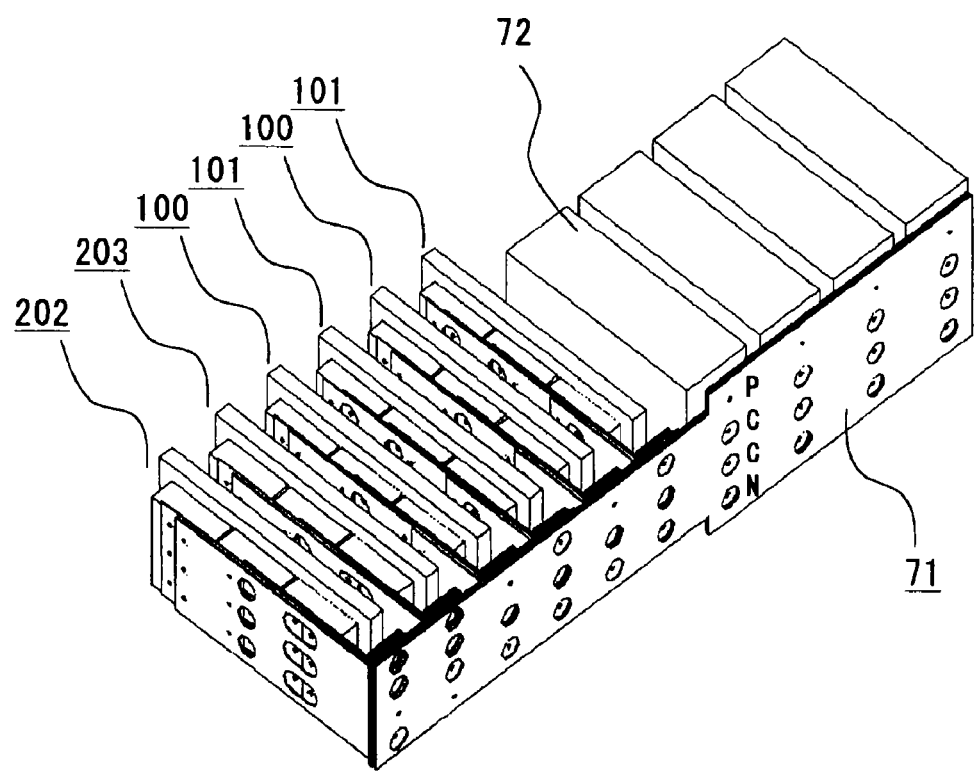
FIG. 24 is a perspective view showing the power conversion device according to the fifth embodiment of the present invention.

FIG. 24 is a diagram showing the construction of the power conversion device according to a fifth embodiment. The positive side arm units 100 and the negative side arm units 101 of the 3-level power conversion devices shown in the first embodiment for two phases and the units 202 and 203 of the 3-phase 2-level power conversion device shown in the fourth embodiment are disposed so as to be spaced from one another so that the respective cooling plates are parallel to one another and the insulation distance between the cooling plate and the terminal of the module connection portion is proper. The laminated bus bar 13 shown in the first embodiment and the laminated bus bar 59 shown in the fourth embodiment are integrally constructed as a laminated bus bar 71, the positive pole (P) and the negative pole (N) are connected to the units 202, 203 of the 3-phase 2-level power conversion device, and the positive pole (P), the negative pole (N) and the intermediate potential (C) are connected to the units 100, 101 of the 3-level power conversion device. The capacitor 72 has two capacitor units therein, and the terminals thereof are connected to the positive pole (P), the intermediate potential (C), the intermediate potential (C) and the negative pole (N), thereby forming capacitors 7,8 serving as DC sources of the circuit diagram of FIG. 23. In FIG. 24, four capacitors are illustrated as being connected to one another in parallel.

In FIG. 24, the capacitors are arranged at the side of the units of the 3-level power conversion device. However, they may be arranged between the unit of the 2-level power conversion device and the unit of the 3-level power conversion device, or arranged on the unit of the 2-level power conversion device and the unit of the 3-level power conversion device if they are connected by a laminated bus bar. The connection from the unit of the 3-level power conversion device to the alternating current side is performed by the connection point to the laminated bus bar 71 as in the case of FIG. 2 of the first embodiment in which current is output as AC from the connection point of the laminated bus bars 11, 12 and 13, and one of the two phases is set to U-phase while the other phase is set to the V-phase. With respect to the connection from the 2-level power conversion unit to the alternating current side, the U-phase and the W-phase are output from the laminated bus bars 57, 58 and the V-phase is output from the connection portion of the laminated bus bar as in the case of FIG. 18 of the fourth embodiment.

By the construction as described above, the cooling plates on which the modules of the unit of the 3-level power conversion device and the unit of the 2-level power conversion device are mounted are spaced from each other in advance because of the module arrangement and the insulation distance, and thus the dead space can be eliminated. Accordingly, the device can be miniaturized and reduced in weight. In both the unit of the 3-level power conversion device and the unit of the 2-level power conversion device, three modules are mounted on one cooling plate, and the cooling plates are arranged in parallel to each other. Therefore, even in the case of the combination of 3-level and 2-level, the mount density of the modules is increased, and the overall device can be miniaturized and reduced in weight. Furthermore, if the cooling plates are constructed so that the mount surfaces thereof for the modules used for the unit of the 3-level conversion device and the unit of the 2-level conversion device are set to the same or both the modules can be mounted on each cooling plate, the same cooling plate can be used for the unit of the 3-level conversion device and the unit of the 2-level conversion device.

In both the units of the 3-level power conversion device and the 2-level power conversion device, the wiring is performed by the laminated bus bar as shown in the first and fourth embodiments, and the module arrangement is properly performed, so that the inductance of the main circuit can be suppressed.

In this case, the 3-level power conversion device according to the first embodiment and the 2-level power conversion device of the fourth embodiment are combined with each other. However, one of the first and second embodiments and one of the third and fourth embodiments may be combined with each other. Furthermore, circuits constructed by 2-level, 3-level, single-phase, 3-phase, etc. such as a power conversion device for performing the conversion of 2-level 3-phase alternating current—direct current—2-level 3-phase alternating current, a power conversion device for performing the conversion of 3-level 3-phase alternating current—direct current—2-level 3-phase alternating current, etc. which are constructed by freely combining the power conversion devices of the first to fourth embodiments can be properly combined with one another.

In each of modifications of the present invention, the DC power source further has an intermediate terminal, the positive side arm has a first switching element connected to a positive electrode terminal of the DC power source, a second switching element connected to the first switching element in series and connected to an alternating current terminal, and a first coupling diode connected between the intermediate connection point of the first and second switching elements and an intermediate terminal which are mounted as the semiconductor elements on a first cooling plate and, and the negative side arm has a third switching element connected to an alternating current terminal, a fourth switching element connected to the third switching element in series and connected to a negative electrode terminal of the DC power source, and a second coupling diode connected between the intermediate connection point of the third and fourth switching element and the intermediate terminal which are mounted as the semiconductor elements on a second cooling plate and, wherein the three-level potentials of the positive electrode terminal, the intermediate terminal and the negative electrode terminal are output to the alternating current terminal by the turn-on/off operation of the switching elements. Therefore, there can be provided a 3-level power conversion device in which the main circuit inductance can be reduced, the surge voltage is suppressed, the overall device can be miniaturized and reduced in weight while the device can be properly cooled, and further the dealing performance in the manufacturing process and the maintenance work can be excellent.

When the connection to the DC power source is led out from one end side of the first and second cooling plates in the arrangement direction of respective semiconductor elements, the first and fourth switching elements are arranged at the farthest positions from the DC power source, or the first and second coupling diodes are arranged as the farthest positions from the DC power source, so that the commutating route is shortened and thus the inductance is further reduced.

Furthermore, the positive side arm has a U-phase positive side switching element connected between the positive electrode terminal of the DC power source and the U-phase alternating current terminal, a V-phase positive side switching element connected between the positive electrode terminal of the DC power source and the V-phase alternating current terminal, and a W-phase positive side switching element connected between the positive electrode terminal of the DC power source and the W-phase alternating current terminal, which are mounted as the semiconductor elements on the first cooling plate, the negative side arm has a U-phase negative side switching element connected between the negative electrode terminal of the DC power source and the U-phase alternating current terminal, a V-phase negative side switching element connected between the negative electrode terminal of the DC power source and the V-phase alternating current terminal, and a w-phase negative side switching element connected between the negative electrode terminal of the DC power source and the W-phase alternating current terminal, which are mounted as the semiconductor elements on the second cooling plate, and the 2-level potentials of the positive electrode terminal and the negative electrode terminal of the DC power source are output to the U-phase, V-phase and W-phase alternating current terminals of 3 phases by the turn-on/off operation of the switching elements. Therefore, there can be provided a 2-level power conversion device in which the inductance of the main circuit is reduced, the surge voltage is suppressed, and the elements are properly cooled, and also which is miniaturized and reduced in weight and excellent in handling performance in the manufacturing process and the maintenance work.

When the connection to the DC power source is led out from one end side of the first and second cooling plates in the arrangement direction of the respective semiconductor elements, the negative side switching element whose phase type is the same as the positive side switching element disposed at the farthest position of the first cooling plate from the DC power source is disposed at the nearest position of the second cooling plate to the DC power source, and the negative side switching element whose phase type is the same as the positive side switching element disposed at the nearest position of the first cooling plate to the DC power source is disposed at the farthest position of the second cooling plate from the DC power source, so that the commutating route is substantially equal among the three phases.

Furthermore, when the connection to the DC power source is led out from one end side of the first and second cooling plates in the arrangement direction of the respective semiconductor elements, the positive side and negative side switching elements of any one phase of the other two phases are disposed at the nearest position to the DC power source, so that the inductance of the phase in which the switching elements are divisionally mounted on the two cooling plates can be reduced.

The arrangements of the positive electrode and the negative electrode of the semiconductor elements mounted on the first and second cooling plates are opposite to each other between the first and second cooling plates, so that the respective laminated bus bars can be designed in the same construction.

Furthermore, when the connection to the DC power source is led out from one end side of the first and second cooling plates in the arrangement direction of the respective semiconductor elements, the laminated bus bar is constructed by a first laminated bus bar for leading out the potential of the semiconductor elements mounted on the first cooling plate to the connection portion located at one end side of the cooling plate, a second laminated bus bar for leading out the potential of the semiconductor elements mounted on the second cooling plate to the connection portion located at one end side of the cooling plate, and a third laminated layer bus bar for connecting the connection portion of the first laminated bus bar, the connection portion of the second laminated bus bar and the DC power source. Therefore, the laminated bus bars are separated from one another, so that the cooling plate at one side, the respective semiconductor elements mounted on the cooling plate concerned and the laminated bus bar connected to them are designed as one unit, the other cooling plate, the respective semiconductor elements mounted on the cooling plate and the laminated bus bar connected to them are designed as another unit, and they are handled every unit, so that the handling in the manufacturing process and the maintenance work can be enhanced.

The first and second laminated bus bars are constructed so that the portions thereof which are designed in a planar shape parallel to the parallel surfaces of the cooling plates and lead out the potentials of the semiconductor elements to the connection portions and the planar connection portions thereof are formed in an L-shape so as to be bent at a right angle in the same direction, and the third laminated bus bar is constructed in a planar shape parallel to both the connection portions. Therefore, the L-shaped connection portion of the laminated bus bar at one side and the L-shaped connection portion of the other laminated bus bar do not interfere in each other. Accordingly, the distance between the unit comprising the cooling plate at one side, the respective semiconductor elements and the laminated bus bar and the unit comprising the other cooling plate, the respective semiconductor elements and the laminated bus bar can be shortened.

The 3-level power conversion device described in any one of claims 1 to 10 and the 2-level power conversion device described in any one of claims 1 to 10 are arranged so that all the cooling plates are parallel to one another and the mount surfaces of the semiconductor elements thereof are set in the same direction, thereby constructing the converter for performing the conversion of AC-DC-AC. Therefore, even in the combination of the 3-level conversion unit and the 2-level conversion unit, the mount density of the modules is increased, and the overall device can be miniaturized and reduced in weight. Furthermore, if the cooling plates are constructed so that the mount surfaces of the modules used for the 3-level conversion unit and the 2-level conversion unit are set to be the same or both the modules can be mounted, the same cooling plate can be used for the 3-level conversion unit and the 2-level conversion unit.

The invention claimed is:

1. A power conversion device comprising:
a first semiconductor element connected between an AC terminal and a positive terminal of a DC power source and that constitutes a positive side arm, and a second semiconductor element connected between the AC terminal and a negative terminal of the DC power source and that constitutes a negative side arm, power conversion being performed between the DC power source and the AC terminal by turn-on/off operation of the semiconductor element;
a first cooling plate on which the semiconductor element constituting the positive side arm is mounted;
a second cooling plate disposed in parallel to the first cooling plate so that a mount surface thereof is set in the same direction as the first cooling plate and both cooling plates are laid overlapping each other; and
a laminated bus bar that connects the semiconductor element constituting the positive side arm and the DC power source, connects the semiconductor element constituting the negative side arm and the DC power source, connects the semiconductor element constituting the positive side arm and the semiconductor element constituting the negative side arm, and includes laminated electrically conductive bus bars with an insulating material sandwiched therebetween.

2. The power conversion device according to claim 1, wherein the DC power source further includes an intermediate terminal;
the positive side arm including a first switching element connected to a positive electrode terminal of the DC power source, a second switching element connected to the first switching element in series and connected to an alternating current terminal, and a first coupling diode connected between an intermediate connection point of the first and second switching elements and an intermediate terminal which are mounted as the semiconductor elements on a first cooling plate; and
the negative side arm including a third switching element connected to an alternating current terminal, a fourth switching element connected to the third switching element in series and connected to a negative electrode terminal of the DC power source, and a second coupling diode connected between an intermediate connection point of the third and fourth switching element and the intermediate terminal which are mounted as the semiconductor elements on a second cooling plate, three-level potentials of the positive electrode terminal, the intermediate terminal and the negative electrode terminal being output to the alternating current terminal by the turn-on/off operation of the switching elements.

3. The power conversion device according to claim 2, wherein when the connection to the DC power source is led out from one end side of the first and second cooling plates in an arrangement direction of the respective semiconductor elements, the first and fourth switching elements are arranged at farthest positions from the DC power source or the first and second coupling diodes are arranged at the farthest positions from the DC power source.

4. The power conversion device according to claim 1, wherein the positive side arm comprises a U-phase positive side switching element connected between a positive terminal of the DC power source and a U-phase AC terminal, a V-phase positive side switching element connected between the positive terminal of the DC power source and a V-phase AC terminal, and a W-phase positive side switching element connected between the positive terminal of the DC power source and a W-phase AC terminal which are mounted as the semiconductor elements on the first cooling plate, and
wherein the negative side arm comprises a U-phase negative side switching element connected between a negative terminal of the DC power source and the U-phase AC terminal, a V-phase negative side switching element connected between the negative terminal of the DC power source and the V-phase AC terminal, and a W-phase negative side switching element connected between the negative terminal of the DC power source and the W-phase AC terminal which are mounted as the semiconductor elements on the second cooling plate, 2-level potentials of the positive terminal and the negative terminal of the DC power source being output to the U-phase, V-phase and W-phase AC terminals of three phases by the turn-on/off operation of the switching elements.

5. The power conversion device according to claim 4, wherein when the connection to the DC power source is led out from one end side of the first and second cooling plates in the arrangement direction of the respective semiconductor elements, the negative side switching element whose phase type is the same as the positive side switching element disposed at a farthest position of the first cooling plate from the DC power source is disposed at a nearest position of the second cooling plate to the DC power source, and the negative side switching element whose phase type is the same as the positive side switching element disposed at a nearest position of the first cooling plate to the DC power source is disposed at a farthest position of the second cooling plate from the DC power source.

6. The power conversion device according to claim 1, wherein arrangements of positive and negative electrodes of the semiconductor elements mounted on the first and second cooling plates are opposite to each other between the first cooling plate and the second cooling plate.

7. The power conversion device according to claim 1, wherein when the connection to the DC power source is led out from one end side of the first and second cooling plates in the arrangement direction of the respective semiconductor elements, the laminated bus bar includes a first laminated bus bar for leading out a potential of the semiconductor elements mounted on the first cooling plate to a connection portion located at one end side of the cooling plate, a second laminated bus bar for leading out a potential of the semiconductor elements mounted on the second cooling plate to a connection portion located at one end side of the cooling plate, and a third laminated bus bar for connecting the connection portion of the first laminated bus bar, the connection portion of the second laminated bus bar, and the DC power source.

8. The power conversion device according to claim 7, wherein the first and second laminated bus bars are constructed so that portions thereof are designed in a planar shape parallel to the parallel surfaces of the cooling plates and lead out the potentials of the semiconductor elements to the connection portions, and the planar connection portions thereof are formed in an L-shape so as to be bent at a right angle in the same direction, and the third laminated bus bar is constructed in a planar shape parallel to both the connection portions.

9. A power conversion device comprising:
a 3-level power conversion device and a 2-level power conversion device claimed in claim 1 that are arranged so that all the cooling plates are parallel to one another and mount surfaces of the semiconductor elements thereof are set in the same direction, thereby constructing a converter for performing conversion of AC-DC-AC.

10. A method of fabricating the power conversion device according to claim 8, comprising:
first connecting the semiconductor elements mounted on the first cooling plate to the first laminated bus bar;
second connecting the semiconductor elements mounted on the second cooling plate to the second laminated bus bar; and
third connecting the connection portions of the first and second laminated bus bars to the third laminated bus bar after the first and second connectings.

11. A power conversion device comprising:
a U-phase positive side switching element connected between a positive terminal of a DC power source and a U-phase AC terminal, a V-phase positive side switching element connected between the positive terminal of the DC power source and a V-phase AC terminal, and a W-phase positive side switching element connected between the positive terminal of the DC power source and a W-phase AC terminal as a semiconductor element constituting a positive side arm; and
a U-phase negative side switching element connected between a negative terminal of the DC power source and the U-phase AC terminal, a V-phase negative side switching element connected between the negative terminal of the DC power source and the V-phase AC terminal, and a W-phase negative side switching element connected between the negative terminal of the DC power source and the W-phase AC terminal as a semiconductor element constituting a negative side arm, 2-level potentials of the positive terminal and the negative terminal of the DC power source being output to the U-phase, V-phase and W-phase AC terminals of three phases by the turn-on/off operation of the switching elements; comprising:

a first cooling plate on which positive side and negative side switching elements of any one phase of the three phases of U, V and W and a positive side or negative side switching element of any one phase of the other two phases are mounted;

a second cooling plate that is disposed in parallel to the first cooling plate so that a mount surface thereof is set in the same direction as the first cooling plate and both cooling plates are laid overlapping each other, and a negative side or positive side switching element of any one phase of the other two phases which is not mounted on the first cooling plate, and positive side and negative side switching elements of the other phase of the other two phases are mounted; and a laminated bus bar that connects the switching element constituting the positive side arm and the DC power source, connects the switching element constituting the negative side arm and the DC power source, and connects the semiconductor element constituting the positive side arm and the semiconductor element constituting the negative side arm, and includes laminated electrically conductive bus bars so that an insulating material is sandwiched therebetween.

12. The power conversion device according to claim 11, wherein when the connection to the DC power source is led out from one end side of the first and second cooling plates in the arrangement direction of the respective semiconductor elements, the positive side and negative side switching elements of any one phase of the other two phases are disposed at a nearest position to the DC power source.

13. The power conversion device according to claim 11, wherein arrangements of positive and negative electrodes of the semiconductor elements mounted on the first and second cooling plates are opposite to each other between the first cooling plate and the second cooling plate.

14. The power conversion device according to claim 11, wherein when the connection to the DC power source is led out from one end side of the first and second cooling plates in the arrangement direction of the respective semiconductor elements, the laminated bus bar includes a first laminated bus bar for leading out a potential of the semiconductor elements mounted on the first cooling plate to a connection portion located at one end side of the cooling plate, a second laminated bus bar for leading out a potential of the semiconductor elements mounted on the second cooling plate to a connection portion located at one end side of the cooling plate, and a third laminated bus bar for connecting the connection portion of the first laminated bus bar, the connection portion of the second laminated bus bar, and the DC power source.

15. The power conversion device according to claim 14, wherein the first and second laminated bus bars are constructed so that the portions thereof are designed in a planar shape parallel to the parallel surfaces of the cooling plates and lead out the potentials of the semiconductor elements to the connection portions, and the planar connection portions thereof are formed in an L-shape so as to be bent at a right angle in the same direction, and the third laminated bus bar is constructed in a planar shape parallel to both the connection portions.

16. A power conversion device comprising:
a 3-level power conversion device and a 2-level power conversion device claimed in claim 11 that are arranged so that all the cooling plates are parallel to one another and mount surfaces of the semiconductor elements thereof are set in the same direction, thereby constructing a converter for performing conversion of AC-DC-AC.

17. A method of fabricating the power conversion device according to claim 15, comprising:
first connecting the semiconductor elements mounted on the first cooling plate to the first laminated bus bar;
second connecting the semiconductor elements mounted on the second cooling plate to the second laminated bus bar; and
third connecting the connection portions of the first and second laminated bus bars to the third laminated bus bar after the first and second connectings.

* * * * *